US011075211B2

(12) United States Patent
Sogawa

(10) Patent No.: US 11,075,211 B2
(45) Date of Patent: Jul. 27, 2021

(54) SEMICONDUCTOR DEVICE WITH NONVOLATILE MEMORY

(71) Applicant: ROHM CO., LTD., Kyoto (JP)

(72) Inventor: Minoru Sogawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 106 days.

(21) Appl. No.: 16/527,581

(22) Filed: Jul. 31, 2019

(65) Prior Publication Data

US 2020/0075612 A1 Mar. 5, 2020

(30) Foreign Application Priority Data

Aug. 29, 2018 (JP) ............................ JP2018-160764

(51) Int. Cl.
*H01L 27/11521* (2017.01)
*H01L 21/8238* (2006.01)

(52) U.S. Cl.
CPC .. *H01L 27/11521* (2013.01); *H01L 21/82385* (2013.01); *H01L 21/823807* (2013.01); *H01L 21/823814* (2013.01); *H01L 21/823857* (2013.01)

(58) Field of Classification Search
CPC combination set(s) only.
See application file for complete search history.

(56) References Cited

U.S. PATENT DOCUMENTS

2009/0152614 A1* 6/2009 Hwang ............. H01L 27/11521 257/315
2013/0026542 A1* 1/2013 Tanaka ................ H01L 27/1087 257/202
2014/0048876 A1* 2/2014 Sekiguchi ......... H01L 29/66674 257/338

FOREIGN PATENT DOCUMENTS

JP 2014-038965 A 2/2014
JP 2015-032741 A 2/2015
JP 2018-037125 A 3/2018
JP 2019-046526 A 3/2019

* cited by examiner

*Primary Examiner* — Nduka E Ojeh
(74) *Attorney, Agent, or Firm* — Rabin & Berdo, P.C.

(57) ABSTRACT

A semiconductor device includes a semiconductor substrate including a first region for a nonvolatile memory cell and a second region that is formed outside the first region and in which a semiconductor element differing from the nonvolatile memory cell is formed, a plurality of first element separating portions by which the first region and the second region are electrically separated from each other, a second element separating portion that is formed in the first region and that partitions the first region into a plurality of active regions, and a dummy region formed adjacently to a first portion that is one, which is closest to the first region, of the plurality of first element separating portions, and, in the semiconductor device, the first portion of the first element separating portion is equivalent in width to the second element separating portion.

15 Claims, 15 Drawing Sheets

9
8
8
Memory region
10
8
8
2

101
53
52
51
67(66)
θ1
56(49)
25
29
11
17(46)
19
24
20
26
θ2
27
θ3
13
W1
25
19
28
51
24
20
θ4
θ5
D1
30
(46)
17
31
15(12)
W2
35
77
34
32
33
θ6
23
D2
θ7
θ8
76
36
73
37
16
(12)
W3
40
78
39
θ9
38
D3
14
22
43
42
106
44

23
101
66
11
106
79
88
85
77
74
84
78
76
73
79
83
89
81
75
82
80
83

14(22)
110
101
66
96
11
105
106
91
98
99
94
18
92
97
93
98
90
104
109
95

FIG. 10A (Write operation)
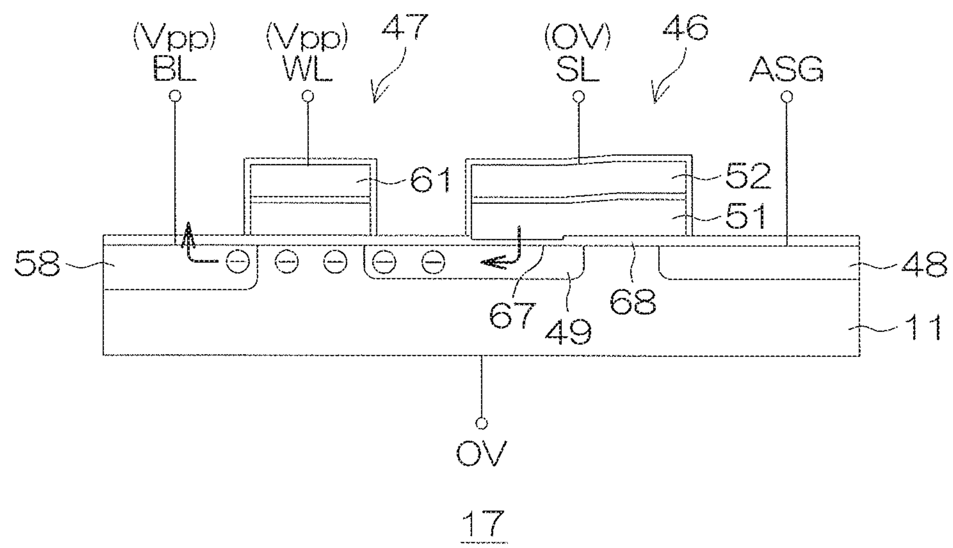
FIG. 10B (Write operation)
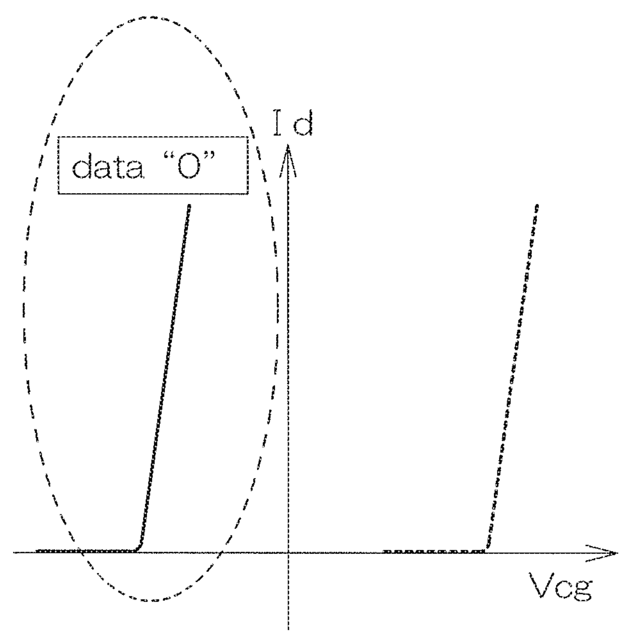

FIG. 11A (Erase operation)
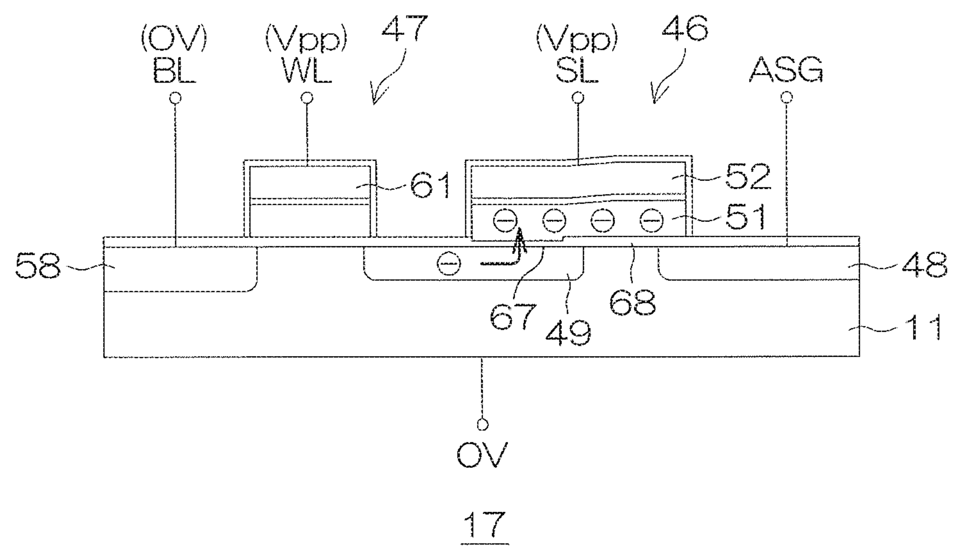
FIG. 11B (Erase operation)
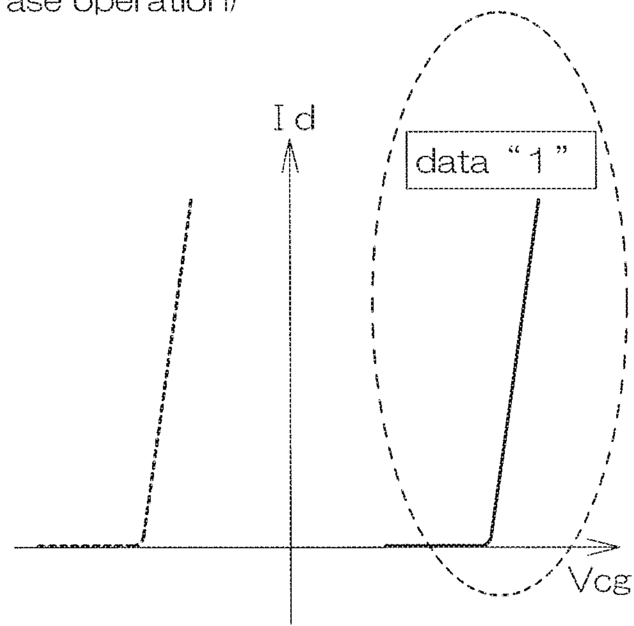

FIG. 12A (Readout operation)
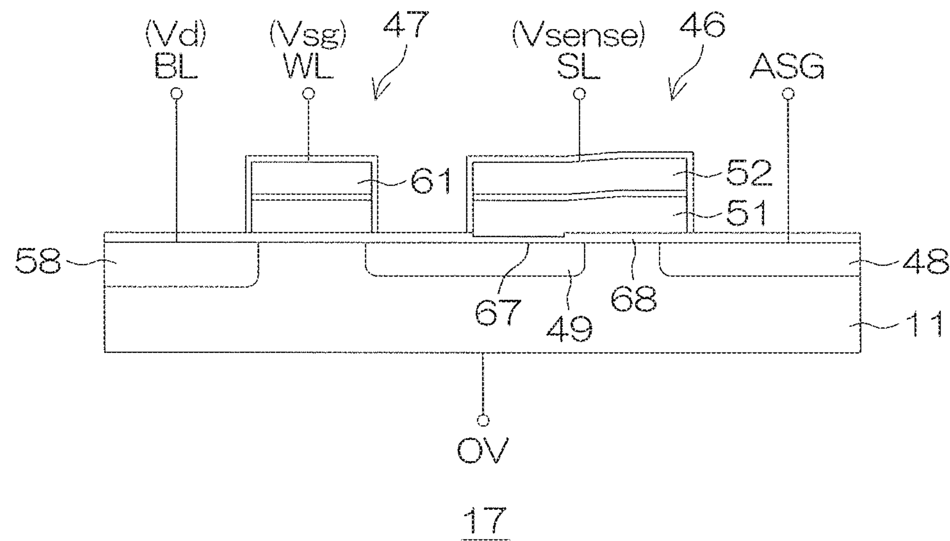
FIG. 12B (Readout operation)
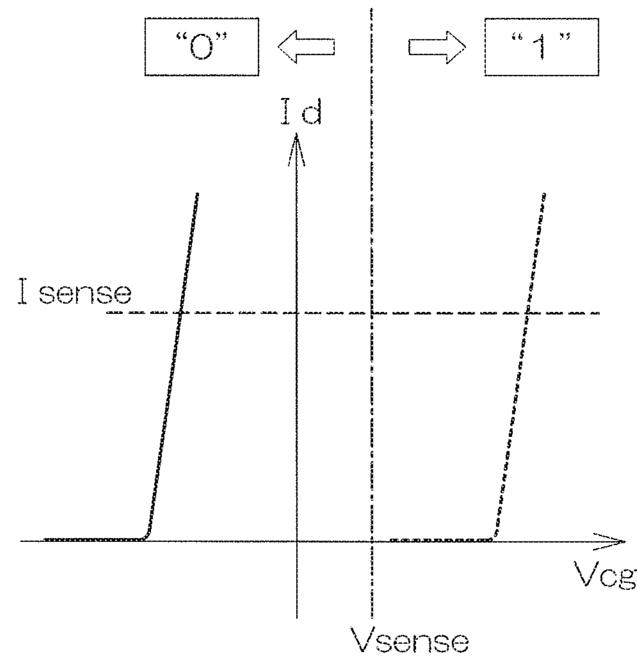

Start condition
S100
Y1 (TW1:5ms)
Y2 (TW2:3.5ms)
Opcode input operation
S200
Trimming data readout operation
S220
Store trimming information in latch circuit LATCH
S240
Address input operation
S300
Data output operation
S400
Stop condition
S500
Apply oscillator enable signal
S520
Turn on oscillator circuit
S540
Switch selector SE
S560
Start write operation
S600

SEMICONDUCTOR DEVICE WITH NONVOLATILE MEMORY

CROSS-REFERENCE TO RELATED APPLICATIONS

The present application corresponds to Japanese Patent Application No. 2018-160764 filed in the Japan Patent Office on Aug. 29, 2018, and the entire disclosure of the application is incorporated herein by reference.

TECHNICAL FIELD

The present invention relates to a semiconductor device that has a nonvolatile memory cell.

BACKGROUND ART

Patent Literature 1 (Japanese Patent Application Publication No. 2015-32741) discloses a semiconductor device that includes a semiconductor substrate having a p type well region, a diffused region formed in the p type well region, a first gate insulating film formed on a channel of the p type well region, and a layered structure that consists of a floating gate, a second gate insulating film, and a control gate, which are formed on the first gate insulating film.

SUMMARY OF INVENTION

An object of the present invention is to provide a semiconductor device that is capable of reducing a variation in threshold voltage between a plurality of memory cells.

BRIEF DESCRIPTION OF DRAWINGS

FIG. 10A and FIG. 10B are views to describe a write operation principle of a nonvolatile memory cell.

FIG. 11A and FIG. 11B are views to describe an erase operation principle of the nonvolatile memory cell.

FIG. 12A and FIG. 12B are views to describe a readout operation principle of the nonvolatile memory cell.

DESCRIPTION OF EMBODIMENTS

Figure 1:
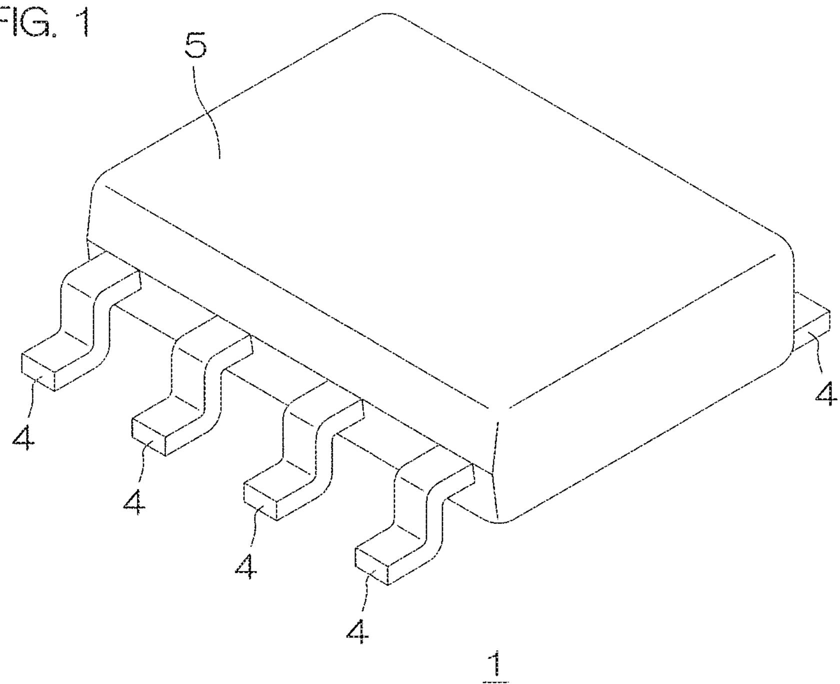
FIG. 1 is a perspective view showing one example of a semiconductor package.

A semiconductor device according to one preferred embodiment of the present invention includes a semiconductor substrate including a first region for a nonvolatile memory cell and a second region that is formed outside the first region and in which a semiconductor element differing from the nonvolatile memory cell is formed, a plurality of first element separating portions by which the first region and the second region are electrically separated from each other, a second element separating portion that is formed in the first region and that partitions the first region into a plurality of active regions, and a dummy region formed adjacently to a first portion that is one, which is closest to the first region, of the plurality of first element separating portions, and, in the semiconductor device, the first portion of the first element separating portion is equivalent in width to the second element separating portion.

According to this configuration, the first region and the second region of the semiconductor substrate are electrically separated from each other by means of the first element separating portions. The dummy region is formed on the second-region side with respect to one (first portion), which is closest to the first region, of the plurality of first element separating portions. The first portion of the first element separating portion has a width equivalent to that of the second element separating portion by providing the dummy regions. This makes it possible to restrain a decrease in the threshold voltage of the nonvolatile memory cell on the side closer to the second region, and therefore it is possible to reduce a variation in the threshold voltage between the plurality of nonvolatile memory cells.

In the semiconductor device according to one preferred embodiment of the present invention, the plurality of first element separating portions may further include a second portion that is formed on a side closer to the second region with respect to the first portion and that is larger in width than the second element separating portion.

In the semiconductor device according to one preferred embodiment of the present invention, the dummy region may be formed in a region sandwiched between the first portion and the second portion of the first element separating portion.

In the semiconductor device according to one preferred embodiment of the present invention, the second portion of the first element separating portion may be formed more deeply than the first portion of the first element separating portion.

In the semiconductor device according to one preferred embodiment of the present invention, the width of the first portion of the first element separating portion may be within ±20% of the width of the second element separating portion.

In the semiconductor device according to one preferred embodiment of the present invention, the width of the second element separating portion may be 0.32 μm to 0.52 μm, and the width of the first portion of the first element separating portion may be 0.32 μm to 0.52 μm.

In the semiconductor device according to one preferred embodiment of the present invention, the nonvolatile memory cell may include a second-conductivity-type source region and a second-conductivity-type drain region that are formed in the active region of the semiconductor substrate of a first-conductivity type with an interval between the second-conductivity-type source region and the second-conductivity-type drain region, a gate insulating film formed on the semiconductor substrate, a floating gate selectively formed on the gate insulating film between the source region and the drain region, a control gate formed on the floating gate, a select gate selectively formed on the gate insulating film between the source region and the drain region, a second-conductivity-type impurity region facing the floating gate in the semiconductor substrate, and a tunnel window that is formed at a portion between the floating gate and the impurity region in the gate insulating film and that is thinner than the gate insulating film around the portion.

In the semiconductor device according to one preferred embodiment of the present invention, the dummy region may have a first-conductivity-type portion at a front-surface portion of the semiconductor substrate.

In the semiconductor device according to one preferred embodiment of the present invention, the semiconductor element may include a transistor that controls a voltage that is supplied to the control gate.

In the semiconductor device according to one preferred embodiment of the present invention, the second element separating portion may include a trench formed at the semiconductor substrate and an insulator buried in the trench, and a lateral surface of the trench may include a first portion that is continuous with a front surface of the semiconductor substrate and that is tilted at an angle $\theta_1$ with respect to the front surface of the semiconductor substrate and a second portion that extends from the first portion of the trench toward a bottom portion of the trench and that is tilted at an angle $\theta_2$ greater than the angle $\theta_1$ with respect to the front surface of the semiconductor substrate.

In the semiconductor device according to one preferred embodiment of the present invention, the lateral surface of the trench may include a third portion that is continuous with the bottom surface of the trench and that is tilted at an angle $\theta_3$ smaller than the angle $\theta_2$ with respect to the front surface of the semiconductor substrate.

In the semiconductor device according to one preferred embodiment of the present invention, the second element separating portion may include an STI (Shallow Trench Isolation) structure.

In the semiconductor device according to one preferred embodiment of the present invention, the control gate may straddle between the plurality of active regions and cover the second element separating portion, and apart of the control gate may be selectively buried in a front-surface portion of the insulator in the trench.

The semiconductor device according to one preferred embodiment of the present invention may further include a fourth element separating portion that is equivalent in width to the second element separating portion, the fourth element separating portion being formed between an active region of one unit made up of the plurality of active regions and a plurality of active regions of one unit adjoining the active region of one unit.

A semiconductor package according to one preferred embodiment of the present invention includes the semiconductor device and a molding resin with which the semiconductor device is sealed.

Preferred embodiments of the present invention will be hereinafter described in detail with reference to the accompanying drawings.

Figure 2:
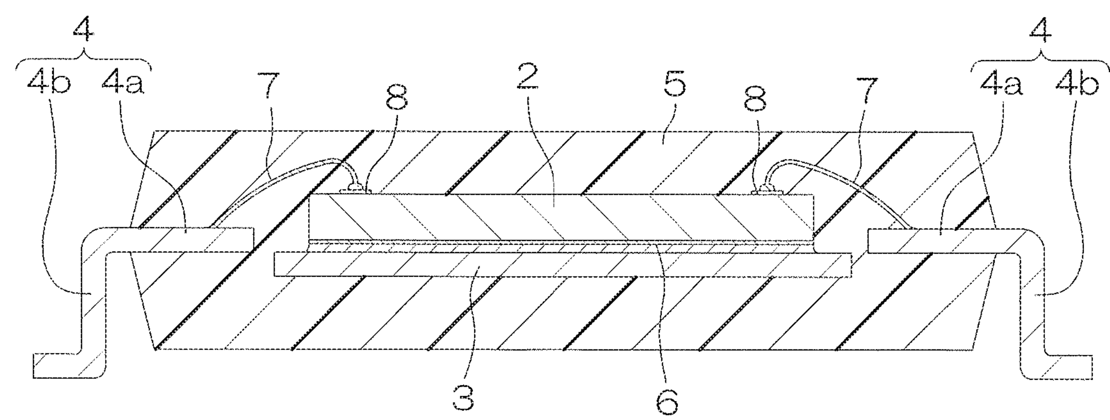
FIG. 2 is a schematic cross-sectional view of the semiconductor package of FIG. 1.

FIG. 1 is a perspective view showing one example of a semiconductor package 1. FIG. 2 is a schematic cross-sectional view of the semiconductor package 1 of FIG. 1.

In FIG. 1 and FIG. 2, a SOP (Small Outline Package) type is used as the semiconductor package 1.

The semiconductor package 1 includes a die pad 3 on which a semiconductor chip 2 is placed, a plurality of leads 4 disposed around the die pad 3, and a molding resin 5 with which the aforementioned components are sealed. The semiconductor chip 2 is joined onto the die pad 3 through a paste 6 that includes, for example, a metal or an insulator.

The lead 4 includes an inner lead portion 4*a* sealed with the molding resin 5 and an outer lead portion 4*b* that is formed integrally with the inner lead portion 4*a* and that is drawn out from the molding resin 5. In the molding resin 5, the inner lead portion 4*a* is electrically connected to a corresponding electrode pad 8 of the semiconductor chip 2 through a wiring member 7 such as a bonding wire. The outer lead portion 4*b* extends toward a lower surface of the molding resin 5, and forms a mounting terminal that is connected to, for example, a mounting board.

Figure 3:
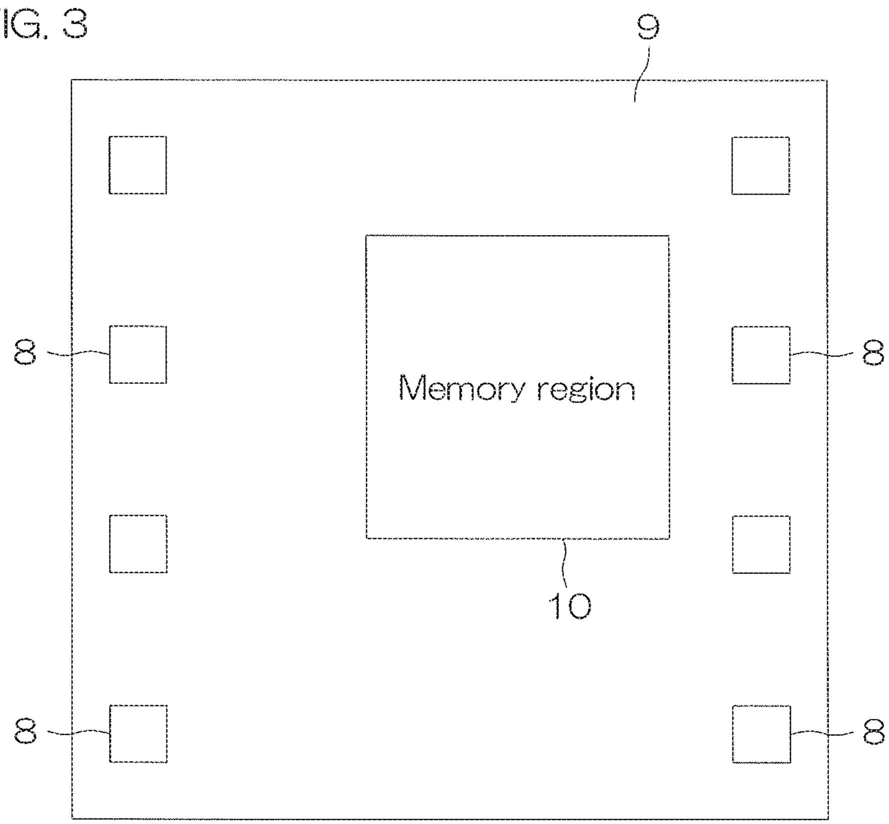
FIG. 3 is a schematic plan view of a semiconductor chip of FIG. 2.

FIG. 3 is a schematic plan view of the semiconductor chip 2 of FIG. 2.

The semiconductor chip 2 is formed in a quadrangular shape in a plan view, and is provided with a plurality of electrode pads 8 on a surface 9 on the side opposite to a surface that faces the die pad 3. The electrode pads 8 are arranged along a pair of sides, which face each other, of the semiconductor chip 2 in a plan view. In the present preferred embodiment, four electrode pads 8 are disposed along each of the pair of sides with intervals between the electrode pads 8.

The semiconductor chip 2 is, for example, an EEPROM (Electrically Erasable and Programmable ROM) chip, and is provided with a memory region 10 in an inner region of the chip with respect to the electrode pads 8. A nonvolatile memory cell 17, a byte select transistor 18, etc., described later are formed in the memory region 10. A peripheral circuit region in which various elements, such as a charge pump, a Zener diode, and a MIS transistor, are formed may be formed around the memory region 10.

Figure 4:
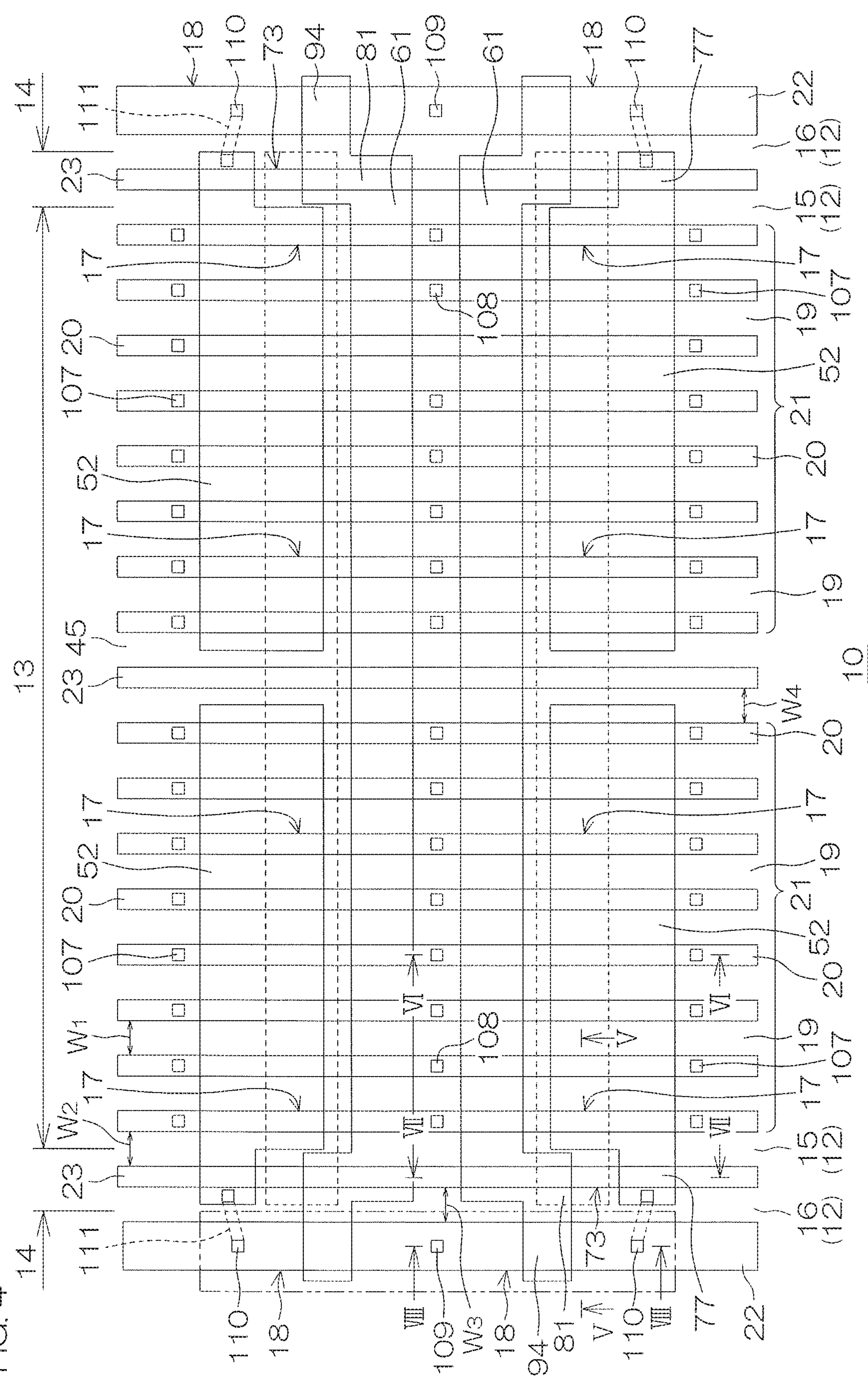
FIG. 4 is a schematic plan view showing one example of a nonvolatile memory cell array.
Figure 5:
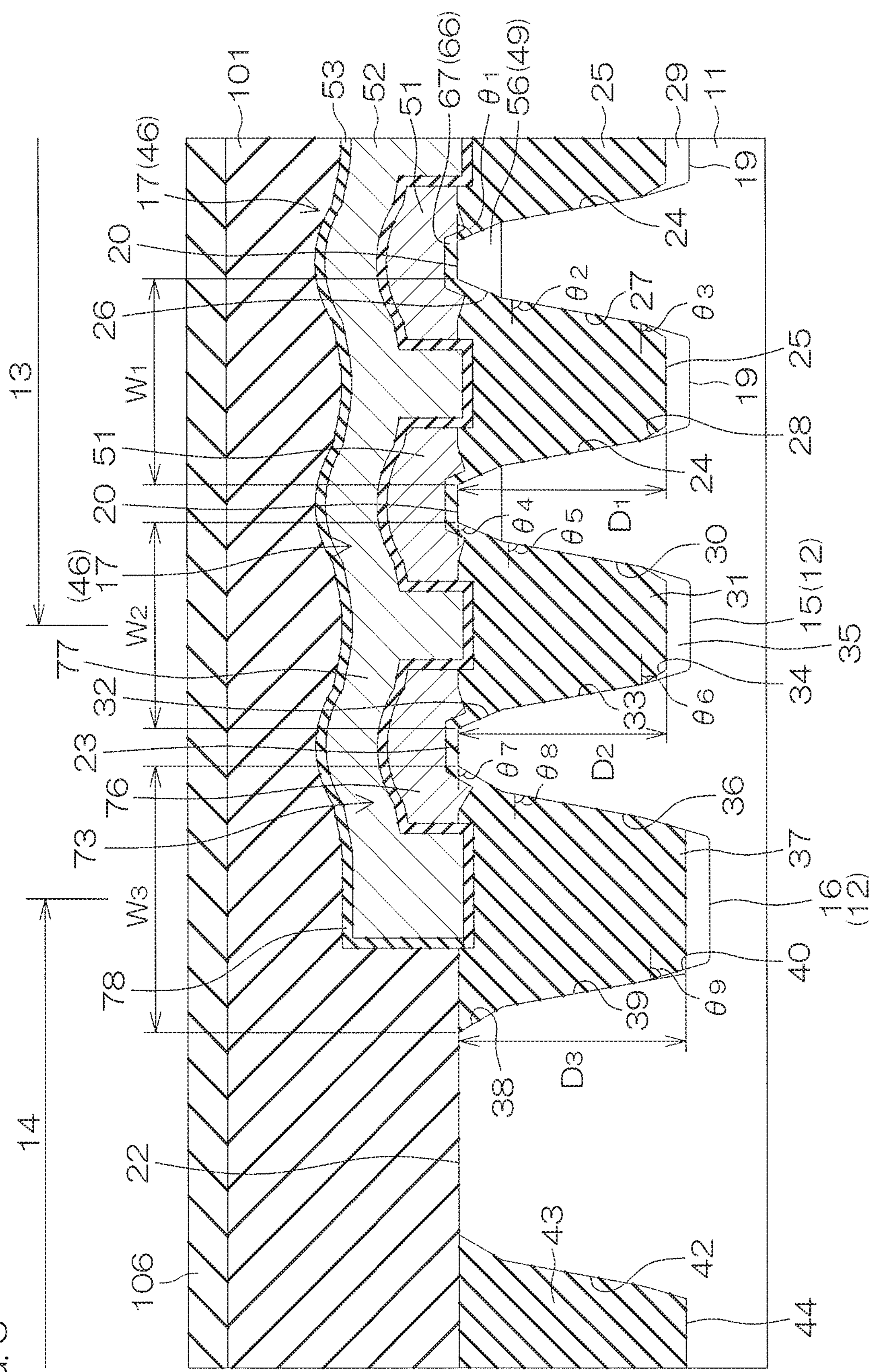
FIG. 5 is a cross-sectional view along line V-V of FIG. 4.
Figure 6:
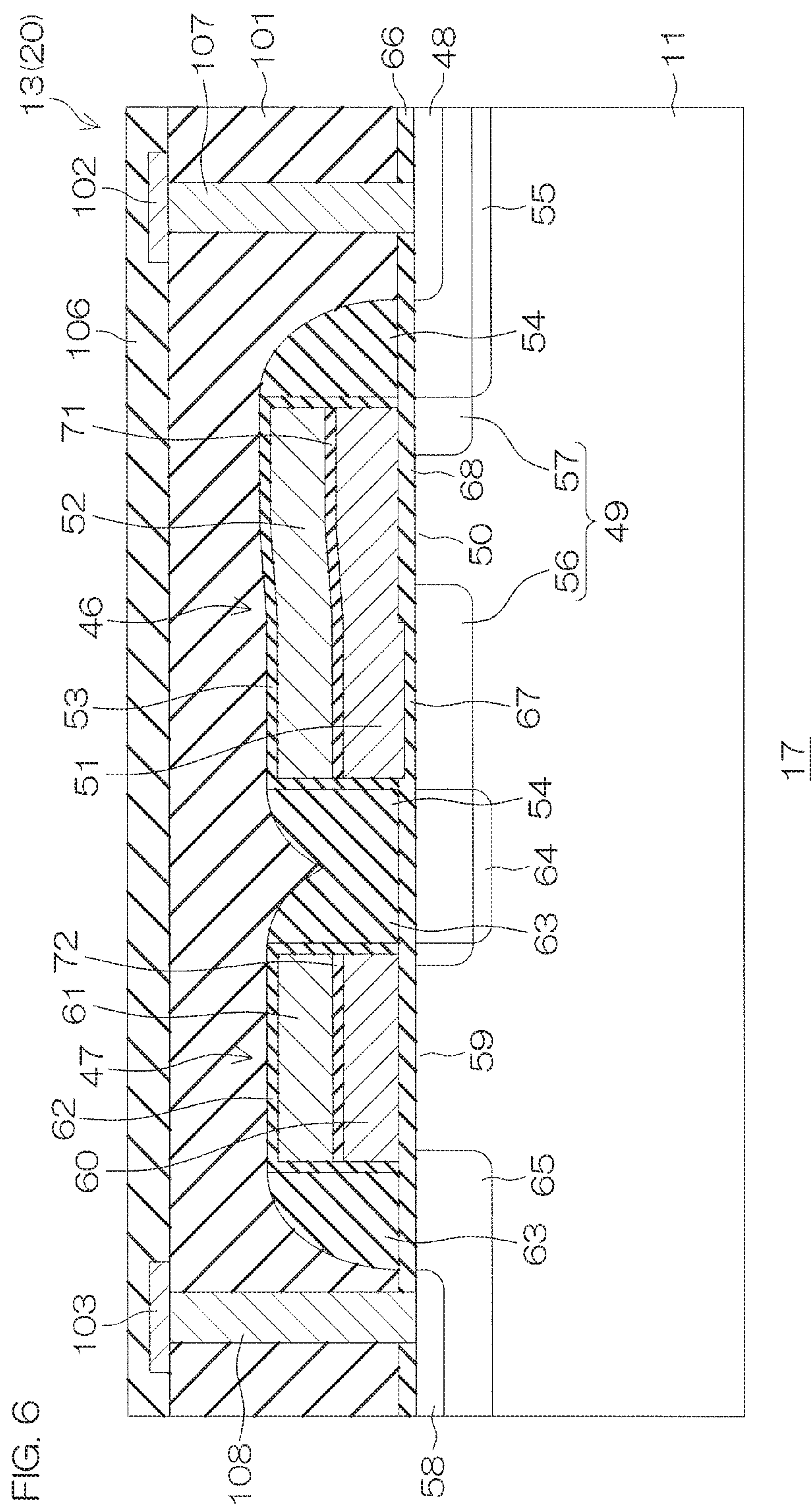
FIG. 6 is a cross-sectional view along line VI-VI of FIG. 4.
Figure 7:
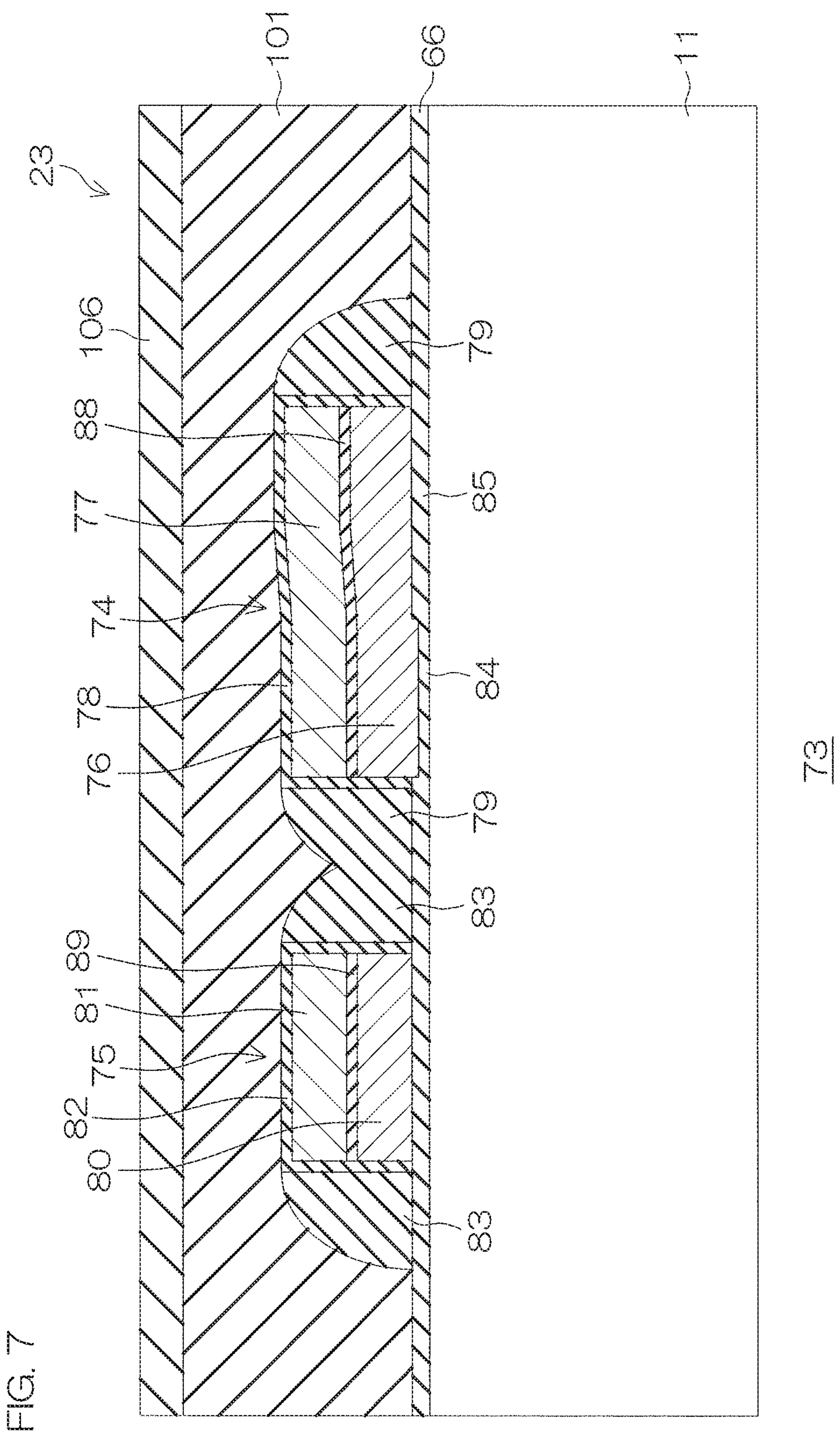
FIG. 7 is a cross-sectional view along line VII-VII of FIG. 4.
Figure 8:
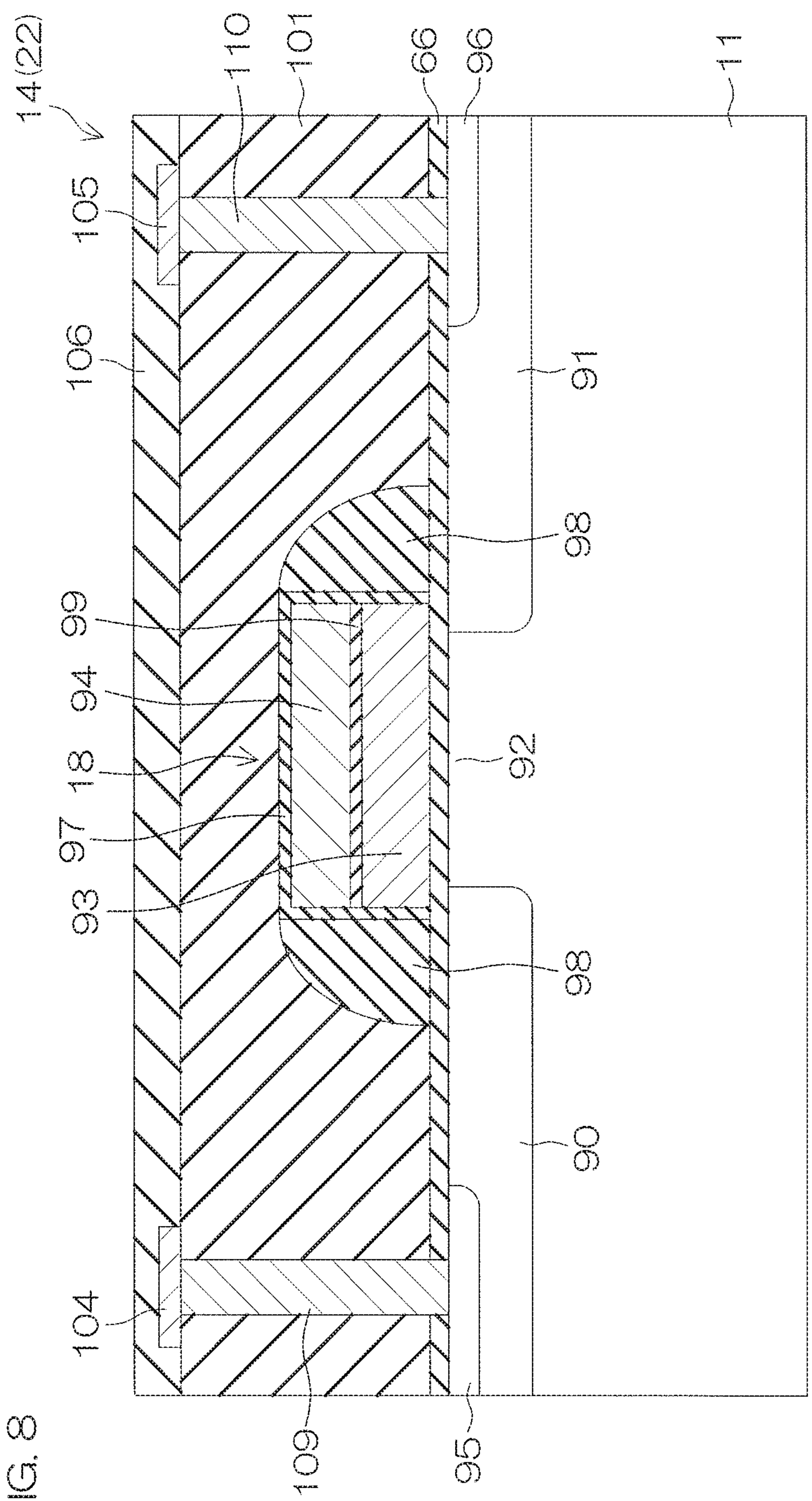
FIG. 8 is a cross-sectional view along line VIII-VIII of FIG. 4.

FIG. 4 is a schematic plan view showing one example of a nonvolatile memory cell array. FIG. 5 is a cross-sectional view along line V-V of FIG. 4. FIG. 6 is a cross-sectional view along line VI-VI of FIG. 4. FIG. 7 is a cross-sectional view along line VII-VII of FIG. 4. FIG. 8 is a cross-sectional view along line VIII-VIII of FIG. 4.

First, referring chiefly to FIG. 4 and FIG. 5, the semiconductor chip 2 includes a p type semiconductor substrate 11 made of, for example, silicon. The semiconductor substrate 11 may have an impurity concentration of, for example, $1\times10^{14}$ $cm^{-3}$ to $1\times10^{15}$ $cm^{-3}$.

The semiconductor substrate 11 is partitioned into a first region 13 and a second region 14 outside the first region 13 by means of a plurality of first element separating portions 12.

The plurality of first element separating portions 12 are formed in such a stripe manner as to become parallel with each other. In the present preferred embodiment, the plurality of first element separating portions 12 may be defined by two element separating portions that include a first portion 15 closer to the first region 13 and a second portion 16 closer to the second region 14. Of course, the plurality of first element separating portions 12 may be defined by stripe-shaped element-separating portions the number of which exceeds two, and, for example, one element separating portion closest to the second region 14 may have a trench structure of the second portion 16 described later, and the other element separating portions may have a trench structure of the first portion 15 described later.

The first region 13 partitioned by the first element separating portion 12 is a region in which the nonvolatile memory cell 17 is formed, and may be called a memory cell region. On the other hand, the second region 14 is a region in which a semiconductor element differing from the nonvolatile memory cell 17 is formed, and may include a row-selecting transistor region 22 in which, for example, the byte select transistor 18, etc., to select a row of the array of the nonvolatile memory cell 17 described later are formed.

The first region 13 is further partitioned into a plurality of active regions 20 by means of a plurality of second element separating portions 19. The second element separating portions 19 are formed in such a stripe manner as to become parallel with the first element separating portions 12. Hence, the plurality of active regions 20 arranged in a stripe manner are formed at the semiconductor substrate 11. In the present preferred embodiment, the stripe-shaped active regions 20 are arranged in the first region 13 in such a manner as to define eight as one unit 21 (for 8 bits).

The row-selecting transistor region 22 serving as an example of the second region 14 may be formed so as to extend in parallel with the active regions 20 of the first region 13. In the present preferred embodiment, the row-selecting transistor region 22 may have a width greater than each of the active regions 20 of the first region 13 as shown in FIG. 4.

A dummy region 23 sandwiched by the plurality of first element separating portions 12 is formed between the first region 13 and the second region 14. The dummy region 23 is a semiconductor region formed in a shape that imitates the active region 20. In the present preferred embodiment, the dummy region 23 is sandwiched between the first portion 15 and the second portion 16 of the first element separating portions 12, and is formed so as to extend in parallel with the active regions 20 of the first region 13.

Additionally, the dummy region 23 may have a width equal to that of each of the active regions 20. If the first element separating portions 12 are provided with the plurality of first portions 15, the dummy region 23 may include a region sandwiched between the first portions 15 that adjoin each other. In other words, if the first element separating portions 12 are provided with the plurality of first portions 15, a plurality of the dummy regions 23 may be arranged in a stripe manner. The number of these dummy regions 23 may be fixed, for example, in accordance with the interval between the first region 13 and the second region 14 and in accordance with the width of the second element separating portion 19.

Hereinafter, a stripe direction of the active region 20, the dummy region 23, and the row-selecting transistor region 22 (i.e., a direction in which the first element separating portion 12 and the second element separating portion 19 extend) is referred to as a "BL (Bit Line) direction" if necessary, and a direction perpendicular to the BL direction is referred to as a "WL direction" if necessary.

Each of the second element separating portions 19 includes a first trench 24 extending in the BL direction and a first insulator 25 buried in the first trench 24.

The first trench 24 is formed in a substantially tapered manner in which its width becomes narrower from a front surface of the semiconductor substrate 11 toward a bottom portion of the first trench 24. In the present preferred embodiment, a lateral surface of the first trench 24 includes a plurality of portions that are tilted with respect to the front surface of the semiconductor substrate 11, and may include a first portion 26, a second portion 27, and a third portion 28 on the basis of a difference in the inclination angle. The first portion 26, the second portion 27, and the third portion 28 of the lateral surface of the first trench 24 may be formed so as to be continuously connected to each other in this order from the front surface of the semiconductor substrate 11 toward the bottom portion of the first trench 24.

The first portion 26 of the lateral surface of the first trench 24 is continuous with the front surface of the semiconductor substrate 11, and is tilted at an angle $\theta_1$ with respect to the front surface of the semiconductor substrate 11. The magnitude of the angle $\theta_1$ may be, for example, 55° to 65°.

The second portion 27 of the lateral surface of the first trench 24 extends from the first portion 26 of the lateral surface of the first trench 24 toward the bottom portion of the first trench 24, and is tilted at an angle $\theta_2$ with respect to the front surface of the semiconductor substrate 11. The magnitude of the angle $\theta_2$ is larger than that of the angle $\theta_1$, and may be, for example, 80° to 84°.

The third portion 28 of the lateral surface of the first trench 24 extends from the second portion 27 of the lateral surface of the first trench 24 toward the bottom portion of the first trench 24, and is continuous with a bottom surface of the first trench 24. The third portion 28 of the lateral surface of the first trench 24 is tilted at an angle $\theta_3$ with respect to the front surface of the semiconductor substrate 11. The magnitude of the angle $\theta_3$ is smaller than that of $\theta_1$ and that of $\theta_2$, and may be, for example, 45° to 55°.

Additionally, the width $W_1$ of the first trench 24 (width in the front surface of the semiconductor substrate 11) is, for example, 0.32 μm to 0.52 μm, and may be, preferably, 0.37 μm to 0.47 μm. Additionally, the depth $D_1$ of the first trench 24 (distance from the front surface of the semiconductor substrate 11 to the bottom surface of the first trench 24) is, for example, 0.5 μm to 0.7 μm, and may be, preferably, 0.55 μm to 0.65 μm.

The first insulator 25 is buried in the first trench 24 from the bottom surface of the first trench 24 to the vicinity of an opening end of the first trench 24. In the present preferred embodiment, the first insulator 25 may be buried in the first trench 24 so as to have an upper surface of the first insulator 25 at a height position of the first portion 26 placed at an upper portion of the first trench 24. Additionally, the first insulator 25 may be made of an insulating material such as silicon oxide ($SiO_2$).

Additionally, in the present preferred embodiment, the upper surface of the first insulator 25 is formed so as to become gradually lower toward the lateral surface of the first trench 24 from a central portion in the width direction of the first trench 24, and hence has a shape in which a central portion of the upper surface of the first insulator 25 is slightly convex.

Additionally, a first p type impurity region 29 whose impurity concentration (for example, its concentration is $1\times10^{15}$ $cm^{-3}$ to $1\times10^{18}$ $cm^{-3}$) is higher than that of the semiconductor substrate 11 is formed at the bottom portion of the first trench 24. The first p type impurity region 29 is formed at the entirety of the bottom portion of the first trench 24 so as to cover the third portion 28 of the lateral surface of the first trench 24 and the bottom surface of the first trench 24.

The first portion 15 of the first element separating portion 12 includes a second trench 30 extending in the BL direction and a second insulator 31 buried in the second trench 30.

The second trench 30 is formed in a substantially tapered manner in which its width becomes narrower from the front surface of the semiconductor substrate 11 toward a bottom portion of the second trench 30. In the present preferred embodiment, a lateral surface of the second trench 30 includes a plurality of portions that are tilted with respect to the front surface of the semiconductor substrate 11, and may include a first portion 32, a second portion 33, and a third portion 34 on the basis of a difference in the inclination angle. The first portion 32, the second portion 33, and the third portion 34 of the lateral surface of the second trench 30 may be formed so as to be continuously connected to each other in this order from the front surface of the semiconductor substrate 11 toward the bottom portion of the second trench 30.

The first portion 32 of the lateral surface of the second trench 30 is continuous with the front surface of the semiconductor substrate 11, and is tilted at an angle $\theta_4$ with respect to the front surface of the semiconductor substrate 11. The magnitude of the angle $\theta_4$ is equal to or is substantially equal to that of the angle $\theta_1$, and may be, for example, 55° to 65°.

The second portion 33 of the lateral surface of the second trench 30 extends from the first portion 32 of the lateral surface of the second trench 30 toward the bottom portion of the second trench 30, and is tilted at an angle $\theta_5$ with respect to the front surface of the semiconductor substrate 11. The magnitude of the angle $\theta_5$ is equal to or is substantially equal to that of the angle $\theta_2$, and may be, for example, 80° to 84°.

The third portion 34 of the lateral surface of the second trench 30 extends from the second portion 33 of the lateral surface of the second trench 30 toward the bottom portion of the second trench 30, and is continuous with a bottom surface of the second trench 30. The third portion 34 of the lateral surface of the second trench 30 is tilted at an angle $\theta_6$ with respect to the front surface of the semiconductor substrate 11. The magnitude of the angle $\theta_6$ is equal to or is substantially equal to that of the angle $\theta_3$, and may be, for example, 45° to 55°.

Additionally, the width $W_2$ (width in the front surface of the semiconductor substrate 11) of the second trench 30 is equivalent to the width $W_1$ of the first trench 24. It should be noted that the term "being equivalent in width" in this specification denotes that "the width $W_1$ of the first trench 24 and the width $W_2$ of the second trench 30 are equal to each other to such an extent as to enable the achievement of the effect of restraining a decrease in the threshold voltage of the nonvolatile memory cell 17," and the two widths $W_1$ and $W_2$ are not necessarily required to completely coincide with each other. In the present preferred embodiment, the width $W_2$ of the second trench 30 is, for example, within ±20% of the width $W_1$ of the first trench 24, and is, specifically, 0.32 μm to 0.52 μm, and may be, preferably, 0.37 μm to 0.47 μm.

Additionally, the depth $D_2$ of the second trench 30 (distance from the front surface of the semiconductor substrate 11 to the bottom surface of the second trench 30) is equal to or is substantially equal to the depth $D_1$ of the first trench 24, and is, for example, 0.5 μm to 0.7 μm, and may be, preferably, 0.55 μm to 0.65 μm.

The second insulator 31 is buried in the second trench 30 from the bottom surface of the second trench 30 to the vicinity of an opening end of the second trench 30. In the present preferred embodiment, the second insulator 31 may be buried in the second trench 30 so as to have an upper surface of the second insulator 31 at a height position of the first portion 32 placed at an upper portion of the second trench 30. Additionally, the second insulator 31 may be made of an insulating material such as silicon oxide ($SiO_2$).

Additionally, in the present preferred embodiment, the upper surface of the second insulator 31 is formed so as to become gradually lower toward the lateral surface of the second trench 30 from a central portion in the width direction of the second trench 30, and hence has a shape in which a central portion of the upper surface of the second insulator 31 is slightly convex.

Additionally, a second p type impurity region 35 whose impurity concentration (for example, its concentration is $1\times10^{15}$ $cm^{-3}$ to $1\times10^{18}$ $cm^{-3}$) is higher than that of the semiconductor substrate 11 is formed at the bottom portion of the second trench 30. The second p type impurity region 35 is formed at the entirety of the bottom portion of the second trench 30 so as to cover the third portion 34 of the lateral surface of the second trench 30 and the bottom surface of the second trench 30.

The second portion 16 of the first element separating portion 12 includes a third trench 36 extending in the BL direction and a third insulator 37 buried in the third trench 36.

The third trench 36 is formed in a substantially tapered manner in which its width becomes narrower from the front surface of the semiconductor substrate 11 toward a bottom portion of the third trench 36. In the present preferred embodiment, a lateral surface of the third trench 36 includes a plurality of portions that are tilted with respect to the front surface of the semiconductor substrate 11, and may include a first portion 38, a second portion 39, and a third portion 40 on the basis of a difference in the inclination angle. The first portion 38, the second portion 39, and the third portion 40 of the lateral surface of the third trench 36 may be formed so as to be continuously connected to each other in this order from the front surface of the semiconductor substrate 11 toward the bottom portion of the third trench 36.

The first portion 38 of the lateral surface of the third trench 36 is continuous with the front surface of the semiconductor substrate 11, and is tilted at an angle $\theta_7$ with respect to the front surface of the semiconductor substrate 11. The magnitude of the angle $\theta_7$ is equal to or is substantially equal to that of the angle $\theta_1$ and to that of the angle $\theta_4$, and may be, for example, 55° to 65°.

The second portion 39 of the lateral surface of the third trench 36 extends from the first portion 38 of the lateral surface of the third trench 36 toward the bottom portion of the third trench 36, and is tilted at an angle $\theta_8$ with respect to the front surface of the semiconductor substrate 11. The magnitude of the angle $\theta_8$ is smaller than that of the angle $\theta_2$ and is smaller than that of the angle $\theta_8$, and may be, for example, 78° to 82°. In other words, the third trench 36 has an open end portion whose spreading width toward the front surface of the semiconductor substrate 11 is larger than that of the first trench 24 and than that of the second trench 30. A difference between $\theta_8$ and $\theta_2$ and a difference between $\theta_8$ and $\theta_5$ result from the fact that the etching rate of the third trench 36 is comparatively large because of the following relation, i.e., width $W_3$ of the third trench 36 described later>width $W_1$ of the first trench 24 and width $W_2$ of the second trench 30.

The third portion 40 of the lateral surface of the third trench 36 extends from the second portion 39 of the lateral surface of the third trench 36 toward the bottom portion of the third trench 36, and is continuous with a bottom surface of the third trench 36. The third portion 40 of the lateral surface of the third trench 36 is tilted at an angle $\theta_9$ with respect to the front surface of the semiconductor substrate 11. The magnitude of the angle $\theta_9$ is larger than that of the angle $\theta_3$ and is larger than that of the angle $\theta_6$, and may be, for example, 55° to 75°.

Additionally, the width $W_3$ of the third trench 36 (width in the front surface of the semiconductor substrate 11) is greater than the width $W_1$ of the first trench 24, and is greater than the width $W_2$ of the second trench 30, and is, for example, 0.4 μm to 0.6 μm, and may be, preferably, 0.45 μm to 0.55 μm.

Additionally, the depth $D_3$ of the third trench 36 (distance from the front surface of the semiconductor substrate 11 to the bottom surface of the third trench 36) is greater than the depth $D_1$ of the first trench 24 and is greater than the depth $D_2$ of the second trench 30, and is, for example, 0.55 μm to 0.75 μm, and may be, preferably, 0.6 μm to 0.7 μm.

The third insulator 37 is buried in the third trench 36 from the bottom surface of the third trench 36 to the vicinity of an opening end of the third trench 36. In the present preferred embodiment, the third insulator 37 may be buried in the third trench 36 so as to have an upper surface of the third insulator 37 at a height position of the first portion 38 placed at an upper portion of the third trench 36. Additionally, the third insulator 37 may be made of an insulating material such as silicon oxide ($SiO_2$).

Additionally, in the present preferred embodiment, the upper surface of the third insulator 37 is formed so as to selectively become gradually lower toward the lateral surface of the third trench 36 from a central portion in the width direction of the third trench 36, and hence has a shape in which a portion on the row-selecting-transistor-region-22 side from the central portion becomes slightly high.

Additionally, a third p type impurity region 41 whose impurity concentration (for example, its concentration is $1\times10^{15}$ $cm^{-3}$ to $1\times10^{18}$ $cm^{-3}$) is higher than that of the semiconductor substrate 11 is formed at the bottom portion of the third trench 36. The third p type impurity region 41 is formed at the entirety of the bottom portion of the third trench 36 so as to cover the third portion 40 of the lateral surface of the third trench 36 and the bottom surface of the third trench 36.

As thus described, both the first element separating portion 12 and the second element separating portion 19 have a trench structure in which the insulators 25, 31, and 37 are buried, and may be called, for example, the first element separating portion 12 and the second element separating portion 19 that are formed by an STI (Shallow Trench Isolation) structure.

Additionally, for example, a third element separating portion 44 formed of a fourth trench 42 and a fourth insulator 43 buried in the fourth trench 42 may be formed on the side opposite to the first element separating portion 12 with respect to the row-selecting transistor region 22. The row-selecting transistor region 22 is defined by a region sandwiched between the first element separating portion 12 (second portion 16) and the third element separating portion 44.

If a width between the active region 20 of one unit 21 consisting of a plurality of active regions 20 and the adjoining active region 20 of one unit 21 is greater than the width of the second element separating portion 19 as shown in FIG. 4, another dummy region 23 that is the same in structure as the aforementioned dummy region 23 may be formed therebetween. Hence, the adjoining units 21 between which the dummy region 23 is sandwiched may be electrically separated by a fourth element separating portion 45 that has a width $W_4$ equal to the width $W_1$ of the first trench 24 of the second element separating portion 19.

Next, referring chiefly to FIG. 4 to FIG. 6, the nonvolatile memory cells 17 are arranged in an array manner (in a matrix manner) in the plurality of active regions 20 partitioned by the second element separating portion 19. For example, in the BL direction, a plurality of nonvolatile memory cells 17 may be formed in each of the active regions 20 arranged in a stripe manner as shown in FIG. 4. Additionally, in the WL direction, a plurality of nonvolatile memory cells 17 may be formed so as to adjoin each other with the second element separating portion 19 between the adjoining memory cells 17 as shown in FIG. 4 and FIG. 5.

Each of the nonvolatile memory cells 17 includes a memory cell transistor 46 and a bit select transistor 47.

As shown in FIG. 6, the memory cell transistor 46 includes an n type source region 48, an n type tunnel diffusion region 49, a floating gate 51 formed so as to face a channel region 50 formed of a part of a p type portion of the semiconductor substrate 11, and a control gate 52 stacked on the floating gate 51.

The thickness of the floating gate 51 may be, for example, 1200 Å to 1800 Å, and the thickness of the control gate 52 may be, for example, 900 Å to 1300 Å.

The floating gate 51 is formed in each of the memory cell transistors 46 one by one. Additionally, each of the floating gates 51 is formed so as to cover an edge portion of the first insulator 25 of the second element separating portion 19 in the WL direction as shown in FIG. 5. In other words, in the first insulators 25 on both sides in the WL direction that are formed so as to sandwich each of the active regions 20 between the first insulators 25 (note that the active region 20 closest to the row-selecting transistor region 22 is sandwiched between the first insulator 25 and the second insulator 31), a portion near the first portion 26 (the first portion 32 of the lateral surface of the second trench 30) of the lateral surface of the first trench 24 of its upper surface is covered with the floating gate 51.

As shown in FIG. 4 and FIG. 5, the control gate 52 is formed linearly extending in the WL direction, and straddles between the plurality of active regions 20, and covers the upper surface and the lateral surface of the plurality of floating gates 51 together. In other words, the control gate 52 is used as a shared electrode among the plurality of nonvolatile memory cells 17. As shown in FIG. 5, the control gate 52 may be buried in a front-surface portion of the first insulator 25 and in a front-surface portion of the second insulator 31 between the adjoining floating gates 51 in the WL direction.

Additionally, both lateral surfaces of the floating gate 51 and both lateral surfaces of the control gate 52 in the BL direction are formed so as to be flush with each other as shown in FIG. 6. Hence, a layered structure consisting of the floating gate 51 and the control gate 52 has a planar lateral surface without level differences, and the control gate 52 does not bulge out from the floating gate 51. In other words, these two gates 51 and 52 are housed in a region on the same space of the semiconductor substrate 11, and therefore it is possible to achieve space-saving. As a result, it is possible to downsize the memory cell transistor 46. Additionally, both lateral surfaces of these gates 51 and 52 are flush with each other, and there is no deviation between the floating gate 51 and the control gate 52, and therefore it is possible to restrain variations in the threshold voltage of the floating gate 51.

An insulating film 53 made of an insulating material, such as silicon oxide, is formed on the lateral surface and the upper surface (upper surface of the control gate 52) of the aforementioned layered structure. Additionally, both lateral surfaces of the floating gate 51 and both lateral surfaces of the control gate 52 are covered with sidewalls 54 each of which is made of an insulating material, such as silicon oxide, together.

The n type source region 48 is respectively formed in an n type source low-concentration region 55 that spreads from directly under the sidewall 54, and an LDD (Lightly Doped Drain) structure is formed in this way.

The n type source low-concentration region 55 may be a region that is formed so as to have a concentration lower than the n type source region 48 and that is formed by implanting impurity ions more deeply than the n type source region 48. Its depth may be, for example, 0.1 μm to 0.3 μm. Additionally, the concentration of the n type source region 48 may be, for example, $1\times10^{17}$ $cm^{-3}$ to $1\times10^{20}$ $cm^{-3}$, and the concentration of the n type source low-concentration region 55 may be, for example, $1\times10^{17}$ $cm^{-3}$ to $2\times10^{18}$ $cm^{-3}$.

Additionally, the n type source low-concentration region 55 may be formed in a self-aligned manner with respect to both the floating gate 51 and the control gate 52. On the other hand, the n type source region 48 may be formed in a self-aligned manner with respect to the sidewall 54. The n type source low-concentration region 55 relaxes an electric field near the n type source region 48, and restrains a hot electron effect.

The n type tunnel diffusion region 49 is formed in a region that faces a part of the floating gate 51 in the semiconductor substrate 11, and the n type tunnel diffusion region 49 functions as a drain region of the memory cell transistor 46. In detail, the n type tunnel diffusion region 49 may include a plurality of regions that are spaced out in the BL direction.

For example, the plurality of n type tunnel diffusion regions 49 may include a first region 56 facing an end portion on the side closer to the bit select transistor 47 of the floating gate 51 and a second region 57 facing an end portion on the side farther from the bit select transistor 47 of the floating gate 51. The first region 56 may be formed so as to overlap with an n type tunnel low-concentration region 64 (described later), and the second region 57 may be formed so as to overlap with the n type source region 48 and with the n type source low-concentration region 55.

The bit select transistor 47 includes an n type drain region 58 formed in the semiconductor substrate 11 with an interval from the n type tunnel diffusion region 49 (the first region 56) defined as a source region of the bit select transistor 47, a first select gate 60 formed so as to face a channel region 59, which is formed of a part of a p type portion of the semiconductor substrate 11 between the n type tunnel diffusion region 49 and the n type drain region 58, and a second select gate 61 stacked on the first select gate 60.

The thickness of the first select gate 60 may be equal to that of the floating gate 51 (for example, 1200 Å to 1800 Å), and the thickness of the second select gate 61 may be equal to that of the control gate 52 (for example, 900 Å to 1300 Å).

The first select gate 60 is formed in each of the bit select transistors 47 one by one. On the other hand, as shown in FIG. 4, the second select gate 61 is formed linearly extending in the WL direction, and straddles between the plurality of active regions 20, and covers the plurality of first select gates 60 together. In other words, the second select gate 61 is used as a shared electrode among the plurality of non-volatile memory cells 17.

Additionally, both lateral surfaces of the first select gate 60 and both lateral surfaces of the second select gate 61 in the BL direction are formed so as to be flush with each other as shown in FIG. 6. Hence, a layered structure consisting of the first select gate 60 and the second select gate 61 has a planar lateral surface without level differences, and the second select gate 61 does not bulge out from the first select gate 60. In other words, these two gates 60 and 61 are housed in a region on the same space of the semiconductor substrate 11, and therefore it is possible to achieve space-saving. As a result, it is possible to downsize the bit select transistor 47.

An insulating film 62 made of an insulating material, such as silicon oxide, is formed on the lateral surface and the upper surface (upper surface of the second select gate 61) of the aforementioned layered structure. Additionally, both lateral surfaces of the first select gate 60 and both lateral surfaces of the second select gate 61 are covered with sidewalls 63 each of which is made of an insulating material, such as silicon oxide, together.

A part, which faces the layered structure consisting of the gates 51 and 52 of the memory cell transistor 46 as shown in FIG. 6, of the sidewall 63 with which the lateral surface of the layered structure consisting of the first and second select gates 60 and 61 is covered may be united with the sidewall 54 of the layered structure consisting of the gates 51 and 52 of the memory cell transistor 46. Hence, an insulator that is formed of the sidewalls 54 and 63 and that selectively has a concave portion at its upper surface may be formed between the memory cell transistor 46 and the bit select transistor 47.

The n type tunnel low-concentration region 64 that spreads directly under an integral piece of the sidewalls 54 and 63 is formed between the memory cell transistor 46 and the bit select transistor 47 in the semiconductor substrate 11.

The n type tunnel low-concentration region 64 may be a region that is formed so as to have a concentration lower than the n type tunnel diffusion region 49 and that is formed by implanting impurity ions more deeply than the n type tunnel diffusion region 49. Its depth may be equal to that of the n type source low-concentration region 55 (for example, 0.1 μm to 0.3 μm). An LDD structure is formed by the n type tunnel low-concentration region 64 and the n type tunnel diffusion region 49 (the first region 56). In the LDD structure, the n type tunnel low-concentration region 64 is formed in a self-aligned manner with respect to both the floating gate 51 and the first select gate 60. Additionally, the concentration of the n type tunnel diffusion region 49 may be, for example, $1\times10^{17}$ $cm^{-3}$ to $1\times10^{19}$ $cm^{-3}$, and the concentration of the n type tunnel low-concentration region 64 may be, for example, $1\times10^{17}$ $cm^{-3}$ to $2\times10^{18}$ $cm^{-3}$.

The n type drain region 58 is respectively formed in an n type drain low-concentration region 65 that spreads from directly under the sidewall 63, and an LDD (Lightly Doped Drain) structure is formed in this way. The n type drain low-concentration region 65 may be a region that is formed so as to have a concentration lower than the n type drain region 58 and that is formed by implanting impurity ions more deeply than the n type drain region 58. Its depth may be equal to that of the n type source low-concentration region 55 (for example, 0.1 μm to 0.3 μm). Additionally, the concentration of the n type drain region 58 may be, for example, $1\times10^{12}$ $cm^{-3}$ to $1\times10^{20}$ $cm^{-3}$, and the concentration of the n type drain low-concentration region 65 may be, for example, $1\times10^{12}$ $cm^{-3}$ to $2\times10^{12}$ $cm^{-3}$.

Additionally, the n type drain region 58 is formed in a self-aligned manner with respect to the sidewall 63. The n type drain low-concentration region 65 relaxes an electric field near the n type drain region 58, and restrains a hot electron effect.

A gate insulating film 66 made of, for example, silicon oxide is interposed between the semiconductor substrate 11 and both of the floating gate 51 and the first select gate 60.

In the gate insulating film 66, a thin film portion that is thinner than the gate insulating film 66 around this thin film portion may be formed at a portion between the n type tunnel diffusion region 49 (the first region 56) and the floating gate 51.

This thin film portion is a tunnel window 67 through which electrons pass by means of FN (Fowler-Nordheim) tunneling between the n type tunnel diffusion region 49 and the floating gate 51. The thickness of the tunnel window 67 may be, for example, 65 Å to 95 Å while the thickness of the gate insulating film 66 (a portion 68 covered with the floating gate 51) around the tunnel window 67 is 260 Å to 390 Å.

Additionally, a boundary portion between the tunnel window 67 and the portion 68 may be formed so as to have a level difference as shown in, for example, FIG. 6 or may be formed so as to become gradually thicker in proportion to an approach to the n type source region 48. In other words, both the tunnel window 67 and the portion 68 may be connected together by means of an inclined portion whose thickness continuously becomes greater without being clearly separated from each other by means of, for example, a level difference.

Additionally, the floating gate 51 and the control gate 52 are insulated from each other by means of an insulating film 71, and the first select gate 60 and the second select gate 61 are insulated from each other by means of an insulating film 72. The insulating films 71 and 72 may be each made of, for example, a film having an ONO (oxide film-nitride film-oxide film) structure in which a silicon nitride film is sandwiched between a pair of silicon oxide films. The thickness of each of the insulating films 71 and 72 may be, for example, 160 Å to 240 Å.

Next, referring chiefly to FIG. 4, FIG. 5, and FIG. 7, a dummy cell 73 is formed in the dummy region 23. Only one dummy cell 73 or a plurality of dummy cells 73 may be formed in the dummy region 23.

The dummy cell 73 may include a first dummy structure 74 and a second dummy structure 75.

As shown in FIG. 7, the first dummy structure 74 includes a first dummy electrode 76 and a second dummy electrode 77 stacked on the first dummy electrode 76.

The thickness of the first dummy electrode 76 may be equal to that of the floating gate 51 (for example, 1200 Å to 1800 Å), and the thickness of the second dummy electrode 77 may be equal to that of the control gate 52 (for example, 900 Å to 1300 Å).

As shown in FIG. 5, the first dummy electrode 76 is formed so as to cover an edge portion of the second insulator 31 and an edge portion of the third insulator 37 in the WL direction in the same way as the floating gate 51. In other words, in the second insulator 31 and the third insulator 37 that are formed so as to sandwich the dummy region 23 therebetween on both sides in the WL direction, a part of the upper surface of the second insulator 31 near the first portion 32 of the lateral surface of the second trench 30 and a part of the upper surface of the third insulator 37 near the first portion 38 of the lateral surface of the third trench 36 are each covered with the first dummy electrode 76.

As shown in FIG. 4 and FIG. 5, the second dummy electrode 77 is formed of a linear extension portion of the control gate 52 extending in the WL direction. In other words, the second dummy electrode 77 may be an electrode formed integrally with the control gate 52.

Additionally, both lateral surfaces of the first and second dummy electrodes 76 and 77 in the BL direction are formed so as to be flush with each other as shown in FIG. 7. Hence, the layered structure consisting of the first and second dummy electrodes 76 and 77 has a planar lateral surface without a level difference, and the second dummy electrode 77 does not bulge out from the first dummy electrode 76. In other words, these two electrodes 76 and 77 are housed in a region on the same space of the semiconductor substrate 11, and therefore it is possible to achieve space-saving. As a result, it is possible to downsize the first dummy structure 74.

An insulating film 78 made of an insulating material, such as silicon oxide, is formed on the lateral surface and the upper surface (upper surface of the second dummy electrode 77) of the aforementioned layered structure. Additionally, both lateral surfaces of the first dummy electrode 76 and both lateral surfaces of the second dummy electrode 77 are covered with sidewalls 79 each of which is made of an insulating material, such as silicon oxide, together.

As shown in FIG. 7, the second dummy structure 75 includes a third dummy electrode 80 and a fourth dummy electrode 81 stacked on the third dummy electrode 80.

The thickness of the third dummy electrode 80 may be equal to that of the floating gate 51 (for example, 1200 Å to 1800 Å), and the thickness of the fourth dummy electrode 81 may be equal to that of the control gate 52 (for example, 900 Å to 1300 Å).

As shown in FIG. 4, the fourth dummy electrode 81 is formed of a linear extension portion of the second select gate 61 extending in the WL direction. In other words, the fourth dummy electrode 81 may be an electrode formed integrally with the second select gate 61.

Additionally, both lateral surfaces of the third and fourth dummy electrodes 80 and 81 in the BL direction are formed so as to be flush with each other as shown in FIG. 7. Hence, the layered structure consisting of the third and fourth dummy electrodes 80 and 81 has a planar lateral surface without a level difference, and the fourth dummy electrode 81 does not bulge out from the third dummy electrode 80. In other words, these two electrodes 80 and 81 are housed in a region on the same space of the semiconductor substrate 11, and therefore it is possible to achieve space-saving. As a result, it is possible to downsize the second dummy structure 75.

An insulating film 82 made of an insulating material, such as silicon oxide, is formed on the lateral surface and the upper surface (upper surface of the fourth dummy electrode 81) of the aforementioned layered structure. Additionally, both lateral surfaces of the third dummy electrode 80 and both lateral surfaces of the fourth dummy electrode 81 are covered with sidewalls 83 each of which is made of an insulating material, such as silicon oxide, together.

As shown in FIG. 7, a part, which faces the layered structure consisting of the electrodes 76 and 77 of the first dummy structure 74, of the sidewall 83 with which the lateral surfaces of the layered structure consisting of the third and fourth dummy electrodes 80 and 81 may be united with the sidewall 79 of the layered structure consisting of the electrodes 76 and 77 of the first dummy structure 74. Hence, an insulator that consists of the sidewalls 79 and 83 and that selectively has a concave portion at its upper surface may be formed between the first dummy structure 74 and the second dummy structure 75.

The gate insulating film 66 is interposed between the semiconductor substrate 11 and both of the first dummy electrode 76 and the third dummy electrode 80.

In the gate insulating film 66, a thin film portion 84 that is thinner than the gate insulating film 66 around this thin film portion 84 may be formed directly under the first dummy electrode 76.

The thickness of the film portion 84 may be, for example, 65 Å to 95 Å while the thickness of the gate insulating film 66 (a portion 85 covered with the first dummy electrode 76) around the thin film portion 84 is 260 Å to 390 Å.

Additionally, a boundary portion between the thin film portion 84 and the portion 85 may be formed so as to have a level difference as shown in, for example, FIG. 7 or may be formed so as to become gradually thicker in proportion to receding from the second dummy structure 75. In other words, both the thin film portion 84 and the portion 85 may be connected together by means of an inclined portion whose thickness continuously becomes greater without being clearly separated from each other by means of, for example, a level difference.

Additionally, the first dummy electrode 76 and the second dummy electrode 77 are insulated from each other by means of an insulating film 88, and the third dummy electrode 80 and the fourth dummy electrode 81 are insulated from each other by means of an insulating film 89. The insulating films 88 and 89 may be each made of, for example, a film having an ONO (oxide film-nitride film-oxide film) structure in which a silicon nitride film is sandwiched between a pair of silicon oxide films. The thickness of each of the insulating films 88 and 89 may be, for example, 160 Å to 240 Å. The insulating films 88 and 89 may be formed through the same process as the aforementioned insulating films 71 and 72.

Additionally, in the first dummy structure 74 and the second dummy structure 75, the semiconductor substrate 11 may have a p type portion that serves as a base of the semiconductor substrate 11 and that is exposed over the entirety of its front surface.

The dummy cell 73 may be a cell in which only the first and second dummy structures 74 and 75 each of which does not have a function serving as a semiconductor element are formed as described above, and yet, for example, a transistor or the like that does not form an array of nonvolatile memory cells 17 and that has a function serving as a semiconductor element may be formed.

Next, referring chiefly to FIG. 4 and FIG. 8, the byte select transistor 18 may be formed in the row-selecting transistor region 22.

The byte select transistor 18 includes an n type source region 90, an n type drain region 91, a first byte select transistor gate 93 formed so as to face a channel region 92 formed of a part of the p type portion of the semiconductor substrate 11 between the n type source region 90 and the n type drain region 91, and a second byte select transistor gate 94 stacked on the first byte select transistor gate 93.

The n type source region 90 and the n type drain region 91 are formed in the semiconductor substrate 11 with an interval between these regions 90 and 91 in the BL direction. The depth of the n type source region 90 and the depth of the n type drain region 91 may be each, for example, 0.1 μm to 0.3 μm. Additionally, the impurity concentration of the n type source region 90 and the impurity concentration of the n type drain region 91 may be each, for example, $1\times10^{17}$ $cm^{-3}$ to $2\times10^{18}$ $cm^{-3}$.

An n type source contact region 95 is formed at a front-surface portion of the n type source region 90. The n type source contact region 95 is formed so as to have a higher concentration than the n type source region 90, and may have an impurity concentration of, for example, $1\times10^{17}$ $cm^{-3}$ to $1\times10^{20}$ $cm^{-3}$.

An n type drain contact region 96 is formed at a front-surface portion of the n type drain region 91. The n type drain contact region 96 is formed so as to have a higher concentration than the n type drain region 91, and may have an impurity concentration of, for example, $1\times10^{17}$ $cm^{-3}$ to $1\times10^{20}$ $cm^{-3}$.

The first byte select transistor gate 93 is formed so as to face the channel region 92 and so as to face a peripheral edge portion of the n type source region 90 and a peripheral edge portion of the n type drain region 91. On the other hand, the second byte select transistor gate 94 is formed of a linear extension portion of the second select gate 61 extending in the WL direction as shown in FIG. 4. In other words, the second byte select transistor gate 94 of the byte select transistor 18 may be an electrode formed integrally with the second select gate 61.

Additionally, the gate insulating film 66 is interposed between the semiconductor substrate 11 and the first byte select transistor gate 93.

Additionally, both lateral surfaces of the first byte select transistor gate 93 and both lateral surfaces of the second byte select transistor gate 94 are formed so as to be flush with each other as shown in FIG. 8. Hence, the layered structure consisting of the first and second byte select transistor gates 93 and 94 has a planar lateral surface without a level difference, and the second byte select transistor gate 94 does not bulge out from the first byte select transistor gate 93. In other words, these two gates 93 and 94 are housed in a region on the same space of the semiconductor substrate 11, and therefore it is possible to achieve space-saving. As a result, it is possible to downsize the byte select transistor 18.

An insulating film 97 made of an insulating material, such as silicon oxide, is formed on the lateral surface and the upper surface (upper surface of the second byte select transistor gate 94) of the aforementioned layered structure. Additionally, both lateral surfaces of the first byte select transistor gate 93 and both lateral surfaces of the second byte select transistor gate 94 are covered with sidewalls 98 each of which is made of an insulating material, such as silicon oxide, together.

Additionally, the first byte select transistor gate 93 and the second byte select transistor gate 94 are insulated from each other by means of an insulating film 99. The insulating film 99 may be made of, for example, a film having an ONO (oxide film-nitride film-oxide film) structure in which a silicon nitride film is sandwiched between a pair of silicon oxide films. The thickness of the insulating film 99 may be, for example, 160 Å to 240 Å. The insulating film 99 may be formed through the same process as the aforementioned insulating films 71 and 72.

An interlayer insulating film 101 made of an insulating material, such as silicon oxide, is stacked on the semiconductor substrate 11. The nonvolatile memory cell 17, the dummy cell 73, and the byte select transistor 18 are covered with the interlayer insulating film 101 together. The thickness of the interlayer insulating film 101 may be, for example, 4400 Å to 6600 Å.

An electrode pattern made of an electroconductive material, such as aluminum, is formed on the interlayer insulating film 101. The electrode pattern may include a source electrode 102 and a drain electrode 103 that are for the nonvolatile memory cell 17 and a source electrode 104 and a drain electrode 105 that are for the byte select transistor 18. A surface protection film 106 made of an insulating material, such as silicon nitride, is formed so as to cover the electrode pattern.

A source contact 107 and a drain contact 108 to connect the source electrode 102 and the drain electrode 103, which are for the nonvolatile memory cell 17, to the n type source region 48 and the n type drain region 58, respectively, may be buried in the interlayer insulating film 101. The drain contact 108 (n type drain region) may be shared between the nonvolatile memory cells 17 adjoining in the BL direction as shown in FIG. 4.

Additionally, a source contact 109 and a drain contact 110 to connect the source electrode 104 and the drain electrode 105, which are for the byte select transistor 18, to the n type source region 90 (n type source contact region 95) and the n type drain region 91 (n type drain contact region 96), respectively, may be buried in the interlayer insulating film 101. The source contact 109 (n type source region 90) may be shared between the byte select transistors 18 adjoining in the BL direction as shown in FIG. 4. Additionally, the drain contact 110 (n type drain region 91) may be electrically connected to the control gate 52 of the memory cell transistor 46 through a wire 111 as shown in FIG. 4.

Figure 9:
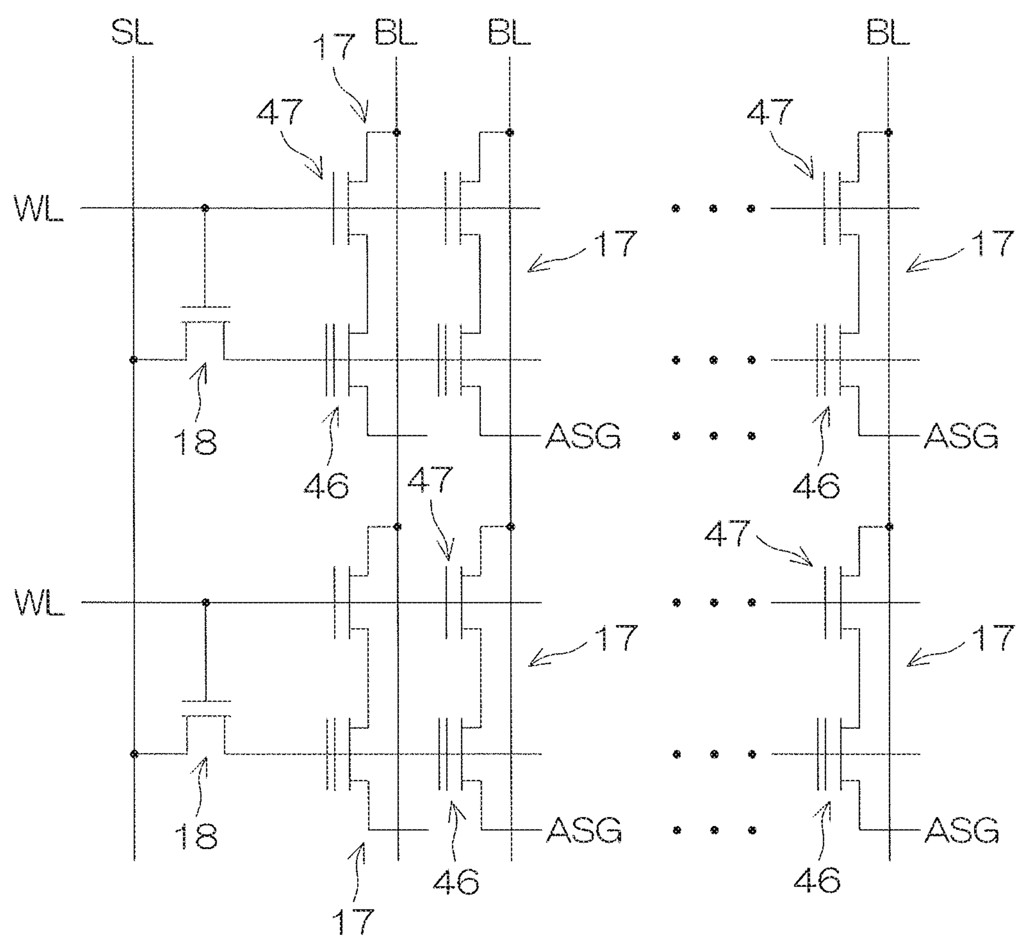
FIG. 9 is a circuit diagram of the nonvolatile memory cell array.

Next, an array circuit diagram of the nonvolatile memory cell 17 is shown in FIG. 9.

As shown in FIG. 9, the semiconductor chip 2 has the nonvolatile memory cells 17 arranged in a matrix manner, and a write operation and a readout operation are performed for each of the nonvolatile memory cells 17 by means of a word line WL and a bit line BL. In each of the nonvolatile memory cells 17, the memory cell transistor 46 and the bit select transistor 47 are connected in series, and the word line WL (second select gate 61) is made by connecting gates of the select transistors 47 of the nonvolatile memory cells 17 arranged in the lateral direction of FIG. 9 together, and the bit line BL is made by connecting drains (drain electrodes 103) of the nonvolatile memory cells 17 arranged in the longitudinal direction of FIG. 9 together, and an ASG (Array Source Ground) is made by bundling sources (source electrodes 102) of the memory cell transistors 46 together.

The control gates 52 (see FIG. 4 to FIG. 6) of the plurality of memory cell transistors 46 arranged in the lateral direction in FIG. 9 are connected together, and the memory cell transistor 46 is connected to a sense line SL through the byte select transistor 18 (drain). The second select gates 61 (see FIG. 4 to FIG. 6) of the plurality of select transistors 47 arranged in the lateral direction in FIG. 9 are connected together, and the select transistor 47 is connected to a word line WL together with the byte select transistor 18 (gate).

Next, a description will be given of an operation principle of the nonvolatile memory cell 17 with reference to FIGS. 10A and 10B to FIGS. 12A and 12B. FIG. 10A and FIG. 10B are views to describe a write operation principle of the nonvolatile memory cell 17. FIG. 11A and FIG. 11B are views to describe an erase operation principle of the nonvolatile memory cell 17. FIG. 12A and FIG. 12B are views to describe a readout operation principle of the nonvolatile memory cell 17. In FIGS. 10A and 10B to FIGS. 12A and 12B, only the reference sign of a component necessary to describe the operation principle of the nonvolatile memory cell 17 is shown among the components shown in FIG. 4 to FIG. 6, and the other reference signs are omitted.

Referring to FIG. 10A and FIG. 10B, a write operation of the nonvolatile memory cell 17 is performed such that, for example, a source (n type source region 48) is opened, and the bit select transistor 47 is brought into an ON state by applying a write voltage Vpp (i.e., programming pulse voltage) to the second select gate 61. In this state, when the write voltage Vpp is applied to a drain (n type drain region 58) under the assumption that the control gate 52 is in a ground potential (0 V), electrons are pulled out to the n type tunnel diffusion region 49 by means of FN tunneling through the tunnel window 67 from the floating gate 51. The write operation of the nonvolatile memory cell 17 is performed in this way. At this time, the threshold voltage of the memory cell transistor 46 becomes lower by the charge of electrons pulled out from the floating gate 51 as shown in FIG. 10B.

On the other hand, referring to FIG. 11A and FIG. 11B, an erase operation of the nonvolatile memory cell 17 is performed such that, for example, a source (n type source region 48) is preset at a ground potential (0 V), and the bit select transistor 47 is brought into an ON state by applying a write voltage Vpp to the second select gate 61. In this state, the write voltage Vpp is applied to the control gate 52, and a drain (n type drain region 58) is set at a ground potential (0 V), and, as a result, electrons are implanted into the floating gate 51 by means of FN tunneling through the tunnel window 67 from the n type tunnel diffusion region 49. The erase operation of the nonvolatile memory cell 17 is performed in this way. At this time, the threshold voltage of the memory cell transistor 46 becomes higher by the charge of electrons implanted into the floating gate 51 as shown in FIG. 11B.

When electrons are implanted into the floating gate 51, the threshold voltage to be applied to the control gate 52 in order to conduct electricity through the memory cell transistor 46 is heightened in a state in which the floating gate 51 has been charged. Therefore, a readout voltage Vsense to be applied to the control gate 52 is preset at a value at which electricity can be conducted between the n type source region 48 and the n type tunnel diffusion region 49 when the floating gate 51 is in a non-charged state (a state in which electrons have been pulled out) and at which a cutoff state between the n type source region 48 and the n type tunnel diffusion region 49 is maintained when the floating gate 51 is in a charged state (a state in which electrons have been implanted).

Thereafter, referring to FIG. 12A and FIG. 12B, the second select gate 61 of the bit select transistor 47 is brought into a high-level state, and the drain (n type drain region 58) is brought into a high-level state, and the readout voltage Vsense is applied to the control gate 52. At this time, it is possible to draw a distinction about whether electrons have been implanted into the floating gate 51 by examining whether an electric current flows toward the source side. If an ON state is reached, and hence an electric current flows toward the source side, and, as a result, a current value (Isense) that has been preset in the circuit is reached, data “0” will be recognized.

It is possible to perform each operation, i.e., to perform an information write operation, an information erase operation, or an information readout operation into or from the nonvolatile memory cell 17 in this way.

In this semiconductor chip 2, the first region 13 and the second region 14 of the semiconductor substrate 11 are electrically separated from each other by means of the plurality of first element separating portions 12. The dummy region 23 is formed on the second-region-14 side with respect to one (first portion 15), which is closest to the first region 13, of the plurality of first element separating portions 12. The first portion 15 of the first element separating portion 12 has a width equivalent to that of the second element separating portion 19 by providing the dummy regions 23. This makes it possible to restrain a decrease in the threshold voltage of the nonvolatile memory cell 17 on the side closer to the second region 14, and therefore it is possible to reduce a variation in the threshold voltage between the plurality of nonvolatile memory cells 17.

Figure 13:
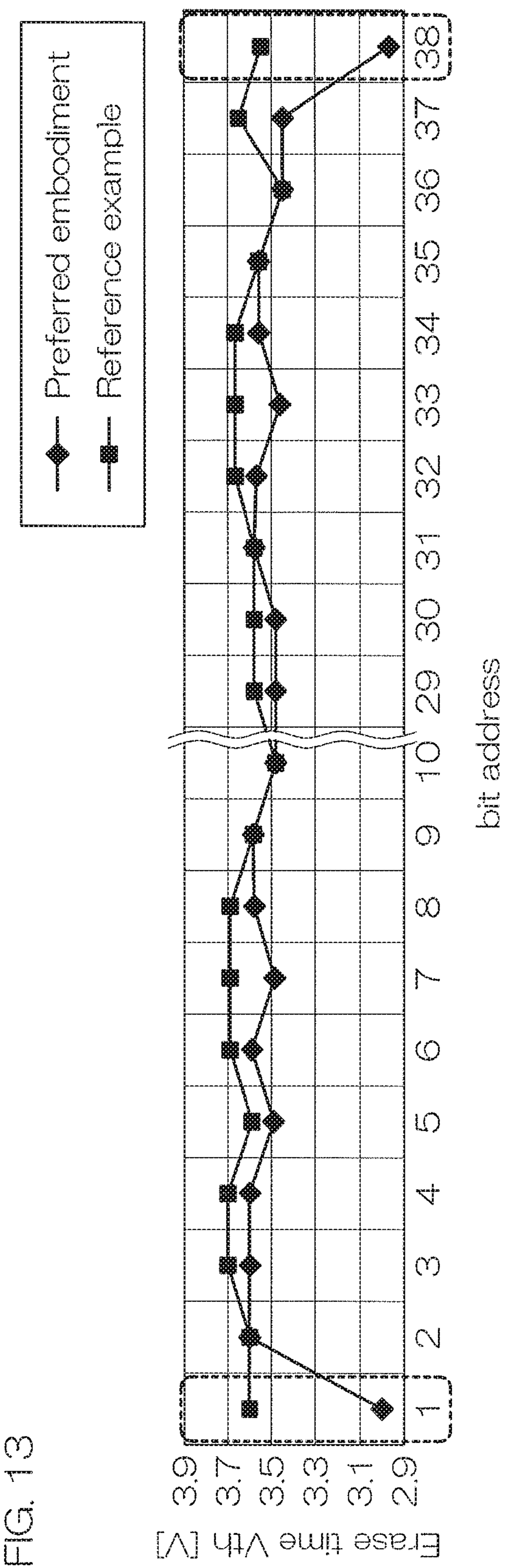
FIG. 13 is a view showing the presence or absence of a variation in threshold voltage between a plurality of nonvolatile memory cells.

More specifically, it is possible to describe the effect of reducing a variation in the threshold voltage with reference to FIG. 13.

In FIG. 13, the cell of the present preferred embodiment is the nonvolatile memory cell 17 in which the dummy region 23 is formed as described above. On the other hand, a reference example is a mode in which the dummy region 23 is not provided and in which the first region 13 and the second region 14 undergo an element separation by means of a broad element-separating portion that has united the first and second portions 15 and 16 of the first element separating portion 12 of FIG. 5 together. In the preferred embodiment and the reference example, bit address 1 and bit address 38 are cells adjacent to the aforementioned byte select transistors 18, respectively. In FIG. 13, "Erase time Vth" denotes a threshold voltage indicated when an inversion layer is created between the n type source region 48 and the n type tunnel diffusion region 49 in performing a readout operation after performing an erase operation of the nonvolatile memory cell 17.

Referring to FIG. 13, in the preferred embodiment in which the first portion 15 of the first element separating portion 12 that has a width equivalent to that of the second element separating portion 19 is provided by providing the dummy region 23, a decrease in the threshold voltage in the cell adjacent to the byte select transistor 18 is small, and a variation is restrained. On the other hand, in the reference example in which the dummy region 23 is not provided, a decrease in the threshold voltage in the cell adjacent to the byte select transistor 18 was shown more noticeably than in the preferred embodiment.

Next, one example of a circuit configuration of the entirety of the semiconductor chip 2 is shown.

Figure 14:
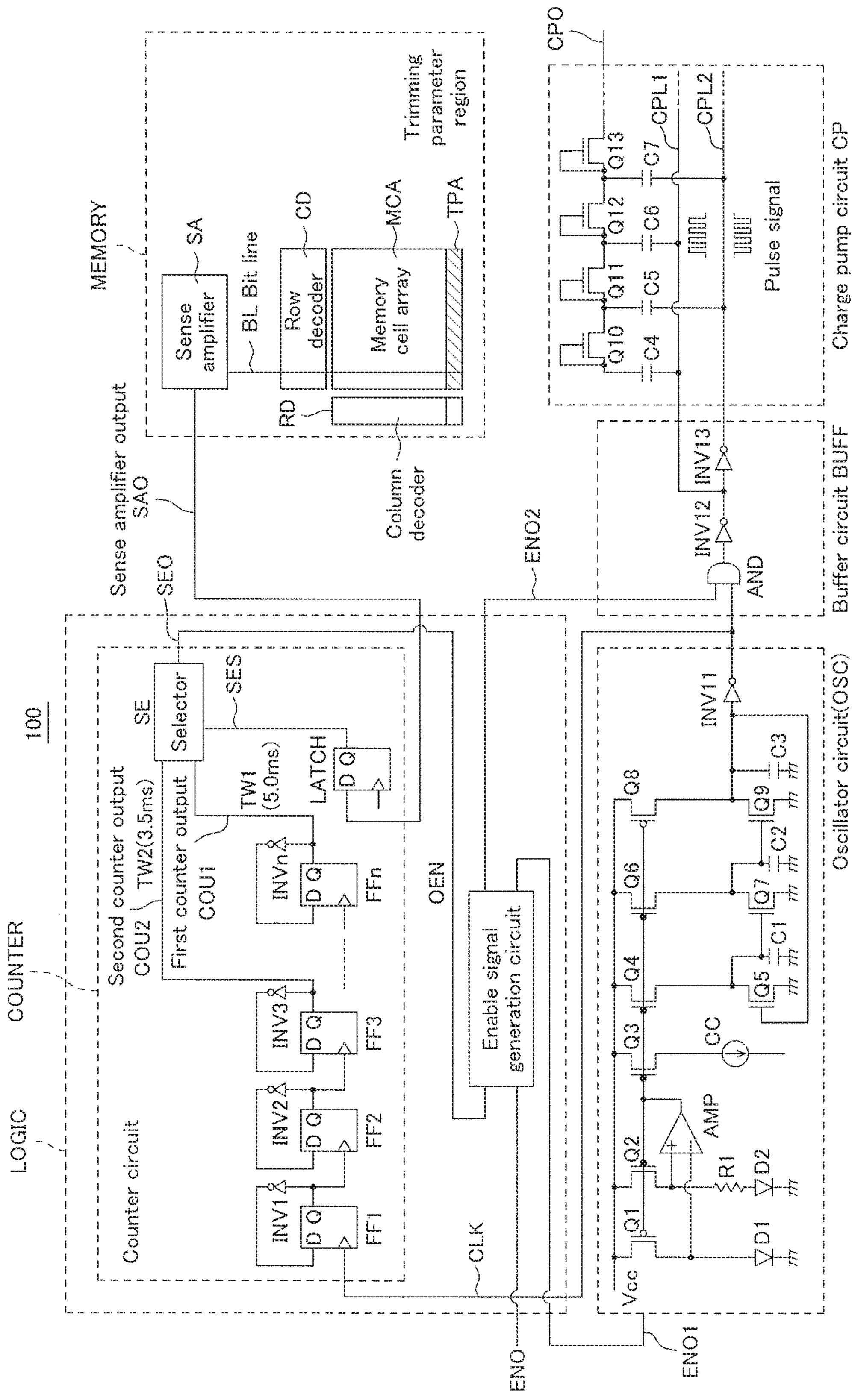
FIG. 14 is a view showing one example of a circuit of the semiconductor chip.

FIG. 14 is a view showing one example of a circuit of the semiconductor chip 2 (semiconductor memory circuit device).

A semiconductor memory circuit device 100 is composed roughly of a memory circuit portion MEMORY, a logic circuit LOGIC, an oscillator circuit OSC, a buffer circuit BUFF, and a charge pump circuit CP.

The memory circuit portion MEMORY is composed of a memory cell array MCA, a trimming parameter region TPA, a column decoder CD, a row decoder RD, and a sense amplifier SA. In the memory cell array MCA, the aforementioned nonvolatile memory cells 17 are arranged in an array manner.

The logic circuit LOGIC is composed of a counter circuit COUNTER and an enable signal generation circuit OEN. Write information is applied to the column decoder CD and to the row decoder RD from the logic circuit LOGIC, and yet these information transmission paths are omitted for descriptive convenience.

The oscillator circuit OSC is composed of transistors Q1 to Q9, a resistor R1, diodes D1 and D2, a constant current source CC, an amplification means AMP, capacitors C1 to C3, and an inverter INV11.

The oscillator circuit OSC includes a bandgap type voltage reference circuit that is made up of the transistors Q1 and Q2, the resistor R1, and the diodes D1 and D2. These transistors, resistors, diodes, and amplification means are well known as a bandgap type voltage reference circuit capable of compensating for temperature dependence to those skilled in the art. The gates of the transistors Q1 and Q2 are each maintained at a predetermined voltage by means of the amplification means AMP. An operational amplifier whose input impedance is extremely large and whose amplification degree is extremely large is employed as the amplification means AMP.

A constant current circuit is made up of the transistor Q3 and the constant current source CC. The gate of the transistor Q3 is connected to the output of the amplification means AMP and to the gates of the transistors Q1 and Q2, and the constant current source CC is connected to its drain.

The transistors Q4 and Q5 make up a first-stage inverter. The first-stage inverter makes up a part of a ring oscillator together with a subsequent-stage inverter. The load of the transistor Q5 is the transistor Q4, and the transistor Q4 supplies a constant current generated by the constant current source CC to the transistor Q5.

The capacitor C1 is connected to a point between an output of the first-stage inverter, i.e., a drain of the transistor Q5 and an earth potential GND. The delay time of the first-stage inverter is adjusted by the capacitor C1, and the oscillation frequency of the entirety of the ring oscillator is set by setting the delay time.

The transistors Q6 and Q7 make up a second-stage inverter. Likewise, the second-stage inverter makes up a part of the ring oscillator together with the preceding-stage inverter and the subsequent-stage inverter. The load of the transistor Q7 is the transistor Q6, and the transistor Q6 supplies a constant current generated by the constant current source CC to the transistor Q7.

The gate of the transistor Q7 is connected to the drain of the transistor Q5 that is an output of the first-stage inverter. The capacitor C2 is connected to a point between the drain of the transistor Q7 and the earth potential GND. The delay time of the second-stage inverter is adjusted by the capacitor C2, and the oscillation frequency of the ring oscillator is set together with the delay time of the first-stage inverter.

The transistors Q8 and Q9 make up a third-stage inverter. The third-stage inverter makes up a part of the ring oscillator together with the second-stage and first-stage inverters that are the preceding-stage inverters. The load of the transistor Q9 is the transistor Q8, and the transistor Q8 supplies a constant current generated by the constant current source CC to the transistor Q9.

The gate of the transistor Q9 is connected to the drain of the transistor Q7 that is an output of the second-stage inverter. The capacitor C3 is connected to a point between the drain of the transistor Q9 and the earth potential GND. The delay time of the third-stage inverter is adjusted by the capacitor C3, and the oscillation frequency of the ring oscillator is set together with the delay times of the preceding-stage inverters, i.e., the delay times of the second-stage and first-stage inverters.

The output of the transistor Q9, i.e., the drain of the transistor Q9 is joined to the input of the transistor Q5, i.e., to the gate of the transistor Q5. In other words, the output of the third-stage inverter is connected to the input of the first-stage inverter, and a circuit configuration is created so that positive feedback is applied to the entirety of the inverters.

It is possible to achieve the configuration of a ring oscillator with inverters by preparing odd-numbered-stage inverters and by returning the output of a final-stage inverter to the input side of a first-stage inverter, which is a well-known process. Although the ring oscillator is made up of inverters of three stages in the present preferred embodiment, the ring oscillator may be made up of inverters of five stages, seven stages, etc. The capacitors C1, C2, and C3 to adjust a delay time have been prepared to perform such an adjustment as to reach a predetermined oscillation frequency, and therefore the capacitors C1, C2, and C3 are not indispensable circuit elements. Although the constant current source is employed as the load of the first-stage inverter, as the load of the second-stage inverter, or as the load of the third-stage inverter, the present invention is not limited to this. For example, a well-known active load that uses CMOS inverters or MOS transistors or a well-known passive load that uses resistors may be employed.

The oscillator circuit OSC includes a ring oscillator that is made up of a bandgap type voltage reference circuit, a constant current circuit, and an inverter driven by the constant current circuit, and therefore it is possible to restrict a variation in the oscillation frequency to a small degree.

A clock signal CLK output from the oscillator circuit OSC is applied to two circuit portions through the inverter INV11. One of the two circuit portions is a counter circuit COUNTER, and the other one is a buffer circuit BUFF.

The counter circuit COUNTER has a role as a so-called timer circuit function to determine the write time into the memory circuit portion MEMORY. The counter circuit COUNTER of FIG. 14 is schematically shown, and those skilled in the art can prepare various counter circuits different from the thus formed circuit configuration, and can apply a modification to the connection of those circuits.

The timer circuit function is made up of, for example, flip-flops FF1, FF2, FF3, . . . FFn. Each of the flip-flops consists of, for example, a D type flip-flop. A clock signal CLK is input into an input terminal of the flip-flop FF1. The Q output of the flip-flop FF1 is applied to the D input terminal through an inverter INV1.

Additionally, the Q output of the flip-flop FF1 is applied to an input terminal of the subsequent flip-flop FF2. The Q output of the flip-flop FF2 is applied to a D input terminal of the flip-flop FF2 through an inverter INV2. Additionally, the Q output of the flip-flop FF2 is applied to an input terminal of the subsequent flip-flop FF3. The Q output of the flip-flop FF3 is applied to a D input terminal of the flip-flop FF3 through an inverter INV3.

A flip-flop (not shown) is joined to flip-flops subsequent to the flip-flop FF3, and the Q outputs (not shown) of those flip-flops are applied to an input terminal of the flip-flop FFn. The Q output of the flip-flop FFn is applied to a D input terminal of the flip-flop FFn through an inverter INVn.

The Q output of the flip-flop FF3 is taken out as a first counter output COU1, and is applied to one input terminal of a selector SE. The Q output of the flip-flop FFn is taken out as a second counter output COU2, and is applied to the other input terminal of the selector SE. The time of the first counter output COU1 is preset at, for example, 3.5 ms, and the time of the second counter output COU2 is preset at, for example, 5.0 ms, respectively. These count times are each used as an information write time into the memory circuit portion MEMORY.

The setting of the information write time into the memory circuit portion MEMORY and the number of times to be selected by the selector SE can be set one by one on the basis of the number of flip-flops and a circuit connection between the output of each of the flip-flops and the selector SE.

The enable signal generation circuit OEN generates an oscillator enable signal ENO1 and a buffer circuit enable signal ENO2 based on an enable signal ENO. The enable signal ENO, the oscillator enable signal ENO1, and the buffer circuit enable signal ENO2 synchronize with the first counter output COU1 and the second counter output COU2. The oscillator enable signal ENO1 is used to pull up or pull down common gates of, for example, p channel type MOS transistors Q1, Q2, Q3, Q4, Q6, and Q8, i.e., is used to fix these transistor common gates either at a low level or at a high level (power source Vcc).

When the electric potential of the common gate is pulled down, the oscillator circuit OSC reaches an enable state, and, when the electric potential of the common gate is pulled up, the oscillator circuit OSC reaches a disable state.

Although a selector output SEO of the selector SE becomes either 3.5 ms or 5.0 ms as a result of selection, whether 3.5 ms or 5.0 ms is selected is determined by a selection signal SES applied to the selector SE. The selection signal SES is determined on the basis of the output of a latch circuit LATCH.

The latch circuit LATCH is made up of a convenient D type flip-flop. A sense amplifier output SAO is applied to the D input of the latch circuit LATCH. For example, an enable signal ENO or an oscillator enable signal ENO1 is applied to the input of the latch circuit LATCH.

The buffer circuit BUFF is made up of an AND-circuit AND, an inverter INV12, and an inverter INV13. The AND-circuit AND has a first role to supply a clock signal CLK to the charge pump circuit CP during a period of time that meets the first counter output COU1 or the second counter output COU2 selected by the selector SE and a second role to generate a signal by which the charge pump circuit CP is appropriately operated. The AND-circuit AND has the first role, and the inverters INV12 and INV13 have the second role, respectively.

The charge pump circuit CP is one of the well-known boosting circuits. The charge pump circuit CP generates a pulse voltage whose peak value is, for example, 16 V in order to drive the memory circuit portion MEMORY.

In order to generate a comparatively high voltage, the transistors Q10, Q11, Q12, Q13, etc., are in a cascade connection state in the charge pump circuit CP, and the capacitors C4, C5, C6, C7, etc., are joined to points between those cascade connection points and pulse signal lines CPL1 and CPL2. The magnitude of each of the capacitors C4 to C7 is about several pF.

The transistors Q10 to Q13 are each made up of, for example, an n channel type MOS transistor, and each of the transistors has a so-called diode configuration in which a gate and a source make a common connection. Pulse signals in which polarities are mutually reversed are applied to the pulse signal line CPL1 and to the pulse signal line CPL2, respectively. The output CPO of the charge pump circuit CP is applied to the row decoder RD, the column decoder CD, and the memory cell array MCA of the memory circuit portion MEMORY.

The memory circuit portion MEMORY is, for example, a nonvolatile memory in which a write operation and an erase operation can be electrically performed as described above. The memory circuit portion MEMORY is, for example, an EEPROM, and is made up of the memory cell array MCA, the trimming parameter region TPA, the row decoder RD, the column decoder CD, and the sense amplifier SA.

Trimming information to select either one of the first and second counter outputs COU1 and COU2 by means of the selector SE is stored in the trimming parameter region TPA. Pieces of trimming information are, for example, “data 0” and “data 1,” and select the first counter output COU1 and the second counter output COU2, respectively. Access to the trimming parameter region TPA is made through the row decoder RD and the column decoder CD both of which are for the trimming parameter region TPA from the logic circuit LOGIC.

“data 0” and “data 1” both of which are for trimming information are imported into the sense amplifier SA through the bit line BL that is for the trimming parameter region TPA, and are applied from the sense amplifier SA to the latch circuit LATCH as a sense amplifier output SAO.

Figure 15A:
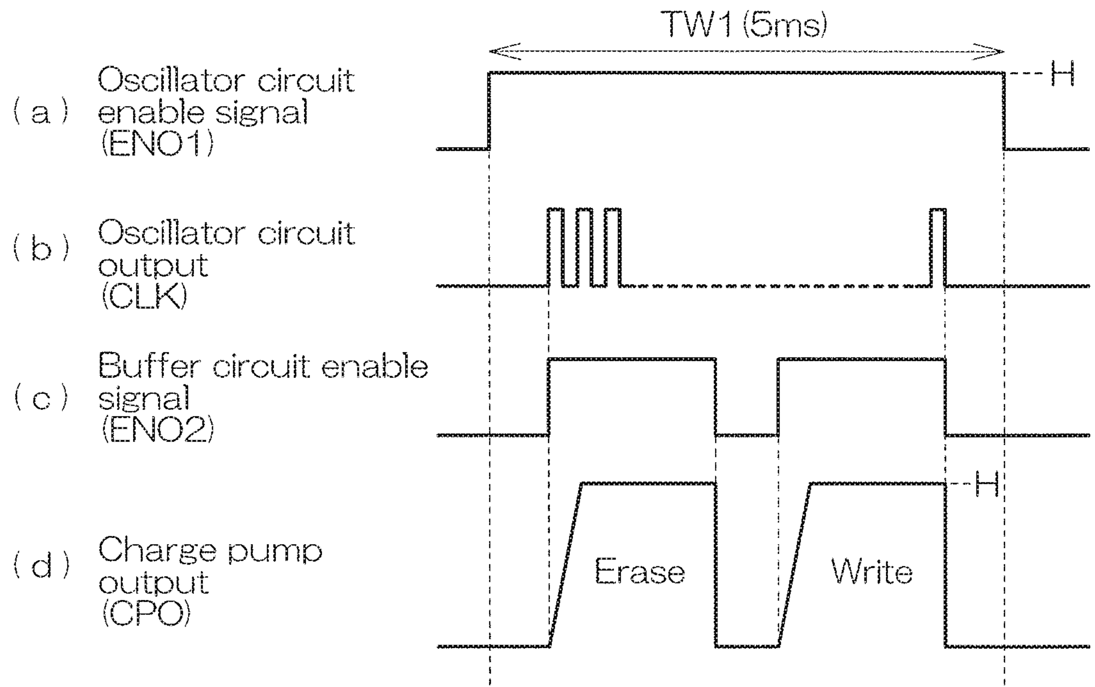
FIG. 15A is a signal waveform chart of a main node when a first write method (write time: 5 ms) is applied in the circuit diagram of FIG. 14.

FIG. 15A shows signal waveforms of a main node of FIG. 14 when an information write operation into the memory circuit portion MEMORY is set at a first write time TW1 (5 ms). FIG. 15A will be hereinafter described with reference to FIG. 14.

FIG. 15A(a) schematically shows the oscillator enable signal ENO1. The oscillator circuit OSC is brought into an enable state, i.e., into an ON state at a period at which the oscillator enable signal ENO1 is in a high level H. A write operation into the memory circuit portion MEMORY is performed at a period at which the oscillator enable signal ENO1 is in a high level H. A period of time in which the oscillator enable signal ENO1 is in a high level H is substantially equal to a period of time of the first counter output COU1 taken out from the Q output of the flip-flop FFn shown in FIG. 14.

FIG. 15A(b) shows a clock signal CLK output from the inverter INV11 that is an output stage of the oscillator circuit OSC. The clock signal CLK is generated when the oscillator circuit OSC is in an enable state, i.e., the clock signal CLK is generated only in the first write time TW1 shown in FIG. 15A(a). The thus formed circuit configuration makes it possible to achieve the power saving of the entirety of both the oscillator circuit OSC and the semiconductor memory circuit device 100. The frequency of the clock signal CLK is set to fall within the range, for example, from several hundred KHz to several MHz.

FIG. 15A(c) shows a buffer circuit enable signal ENO2. The buffer circuit enable signal ENO2 is generated by the enable signal generation circuit OEN. The buffer circuit enable signal ENO2 is prepared to bring the buffer circuit BUFF into an enabled state and a disable state. The buffer circuit BUFF is prepared to drive the charge pump circuit CP of the subsequent stage in an appropriate manner and in a power-saving mode.

FIG. 15A(d) shows the output of the charge pump circuit CP. The charge pump output CPO is supplied to the row decoder RD, the column decoder CD, and the memory cell array MCA in order to drive the memory circuit portion MEMORY. At a period at which the charge pump output CPO is in a high level H, an erase operation and a write operation are performed with respect to the memory circuit portion MEMORY.

Figure 15B:
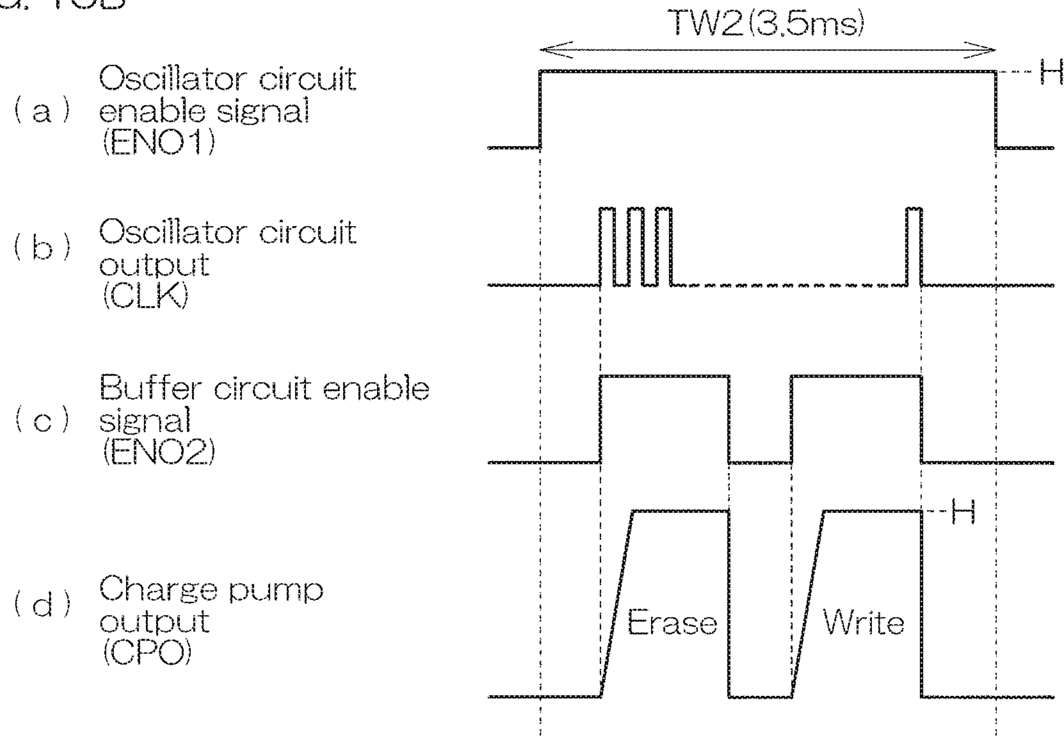
FIG. 15B is a signal waveform chart of a main node when a second write method (write time: 3.5 ms) is applied in the circuit diagram of FIG. 14.

FIG. 15B shows signal waveforms of a main node of FIG. 14 when an information write operation into the memory circuit portion MEMORY is set at a second write time TW2 (3.5 ms). FIG. 15B will be hereinafter described with reference to FIG. 14.

FIG. 15B(a) schematically shows the oscillator enable signal ENO1. The oscillator circuit OSC is brought into an enable state, i.e., into an ON state at a period at which the oscillator enable signal ENO1 is in a high level H. A write operation into the memory circuit portion MEMORY is performed at a period at which the oscillator enable signal ENO1 is in a high level H. A period of time of the oscillator enable signal ENO1 is substantially equal to a period of time of the second counter output COU2 taken out from the Q output of the flip-flop FF3 shown in FIG. 14.

FIG. 15B(b) shows a clock signal CLK output from the inverter INV11 that is an output stage of the oscillator circuit OSC. The clock signal CLK is generated when the oscillator circuit OSC is in an enable state, i.e., the clock signal CLK is generated only in the second write time TW2 shown in FIG. 15B(a). The thus formed circuit configuration makes it possible to achieve the power saving of the entirety of both the oscillator circuit OSC and the semiconductor memory circuit device 100. The frequency of the clock signal CLK is set to fall within the range, for example, from several hundred KHz to several MHz.

FIG. 15B(c) shows a buffer circuit enable signal ENO2. The buffer circuit enable signal ENO2 is generated by the enable signal generation circuit OEN. The buffer circuit enable signal ENO2 is prepared to bring the buffer circuit BUFF into an enabled state and a disable state. The buffer circuit BUFF is prepared to drive the charge pump circuit CP of the subsequent stage in an appropriate manner and in a power-saving mode.

FIG. 15B(d) shows the output of the charge pump circuit CP. The charge pump output CPO is supplied to the row decoder RD, the column decoder CD, and the memory cell array MCA in order to drive the memory circuit portion MEMORY. At a period at which the charge pump output CPO is in a high level H, an erase operation and a write operation are performed with respect to the memory circuit portion MEMORY.

Here, a description will be given of a relationship between the first write time TW1 of FIG. 15A and the second write time TW2 of FIG. 15B. The magnitude of the first write time TW1 and the magnitude of the second write time TW2 can be set at any time on the side on which semiconductor memory circuit devices are manufactured and provided.

However, it has been understood that, if the write time exceeds 5 ms, the impression that a period of time of a write operation is long will be given to the user side, and an influence will be exerted on competitiveness in the production and sales of semiconductor memory circuit devices. Properly speaking, the threshold voltage width in memory-cell information "0" and "1" can be taken larger in proportion to the length of the write time, and a margin for the threshold voltage between both pieces of information is increased, and therefore this is desirable. However, as described previously, there is a trade-off relationship between a high number of rewrite operations and a high-speed rewrite operation, and, if the write time (rewrite time) is set so as to exceed 5 ms in order to prioritize the high number of rewrite operations, it becomes impossible to perform the high-speed rewrite operation, and therefore, by rule of thumb, it has been understood that the maximum value of the write time is 5 ms.

Additionally, in the present preferred embodiment, the second write time TW2 was set at 3.5 ms. Properly speaking, in order to realize the high-speed operation of the semiconductor memory circuit device, it can be said that the second write time TW2 is set preferably at an even shorter period of time than 3.5 ms. However, it has been understood that, if the write time is set at an even shorter period of time than 3.5 ms, the threshold voltage width in memory-cell information "0" and "1" becomes smaller, and a margin for the threshold voltage between both pieces of memory-cell information is narrowed, and therefore this is undesirable.

The present inventor has repeatedly made experiments, and, as a result, has understood that a permissible longest write time is 5 ms, and a shorter write time is from 3 ms to 5 ms, which is a 0.6-to-0.7 range of 5 ms, and is, preferably, 3.5 ms.

Figure 16:
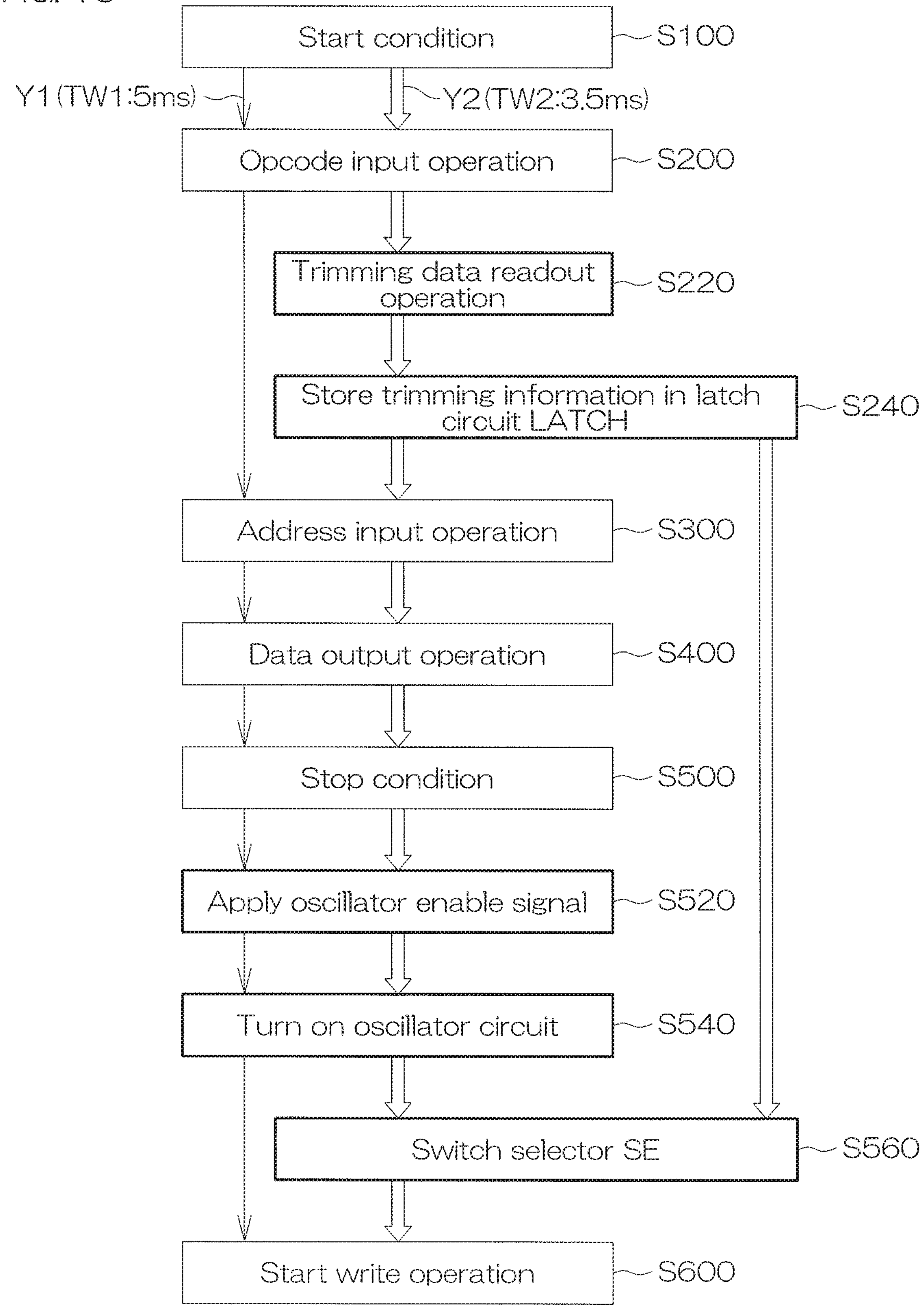
FIG. 16 is a flow chart when the first write method and the second write method are applied.

FIG. 16 shows one process/drive flow when an information write operation into the semiconductor memory circuit device 100 of FIG. 14 is performed at the first write time TW1 and the second write time TW2 shown in FIG. 15A and FIG. 15B, respectively. FIG. 16 will be hereinafter described with reference to FIG. 14, FIG. 15A, and FIG. 15B.

Two write methods, i.e., a first write method Y1 and a second write method Y2 are shown in FIG. 16. The first write method Y1 performs a write operation at the first write time TW1=5 ms shown in FIG. 15A. The first write method Y1 (TW1) is a write method in which a so-called high rewrite-operation number is prioritized while placing emphasis on the number of write operations.

The second write method Y2 (TW2) performs a write operation at the second write time TW2=3.5 Ms shown in FIG. 15B. The second write method Y2 (TW2) is a write method in which a so-called high-speed rewrite operation is realized while prioritizing the write time.

Step S100 is a start condition. In the start condition, a so-called start bit showing the start of communication is input into the logic circuit LOGIC. In step S100, for example, start bit "1" is input.

Step S200 is to perform an opcode input operation. In the opcode input operation, for example, "01" of, for example, 2 bits is input.

Step S300 is to perform an address input operation. In the address input operation, an address of, for example, 6 bits is input.

Step S400 is to perform a data output operation. In the data output operation, data is output from the address specified in step S300.

Step S500 is a stop condition. The stop condition is a step in which the end of a series of instructions from step S100 to step S400 is reported and in which the following start bit is determined.

Step S600 shows the start of a write operation. The start of a write operation is received, and a write operation into the memory cell array MCA from the logic circuit LOGIC is performed through the row decoder RD and the column decoder CD. A signal waveform of each portion in step S600 is shown in FIG. 15A and FIG. 15B.

In the first write method Y1, step S100, step S200, step S300, step S400, and step S500 are performed in this order during a period until the process reaches "start of write operation" of step S600.

Additionally, in the first write method Y1, two steps, i.e., step S520 and step S540 are performed during a period from "stop condition" of step S500 to "stop condition" of step S600. These two steps may be performed, for example, immediately after "opcode input operation" of step S200 without being performed after the stop condition of step S500.

In FIG. 16, the second write method Y2 (TW2) is shown as being performed at the second write time TW2 (3.5 ms) in the present preferred embodiment. Here, the drive/process flow of the second write method Y2 (TW2) will be described, and points of the second write method Y2 differing from those of the first write method Y1 will be described.

Step S220 is to perform a "trimming data readout operation." The "trimming data readout operation" denotes that pieces of trimming information stored in the trimming parameter region TPA are read out, and are imported into the sense amplifier SA. The trimming information is information to specify the second write time TW2.

Step S240 is to store the trimming information in the latch circuit LATCH. The information stored in the latch circuit LATCH is applied to the selector SE. The information to be stored in the latch circuit LATCH is "1" or "0."

In step S560, based on the information stored in the latch circuit LATCH, the selector SE performs switching from the first counter output COU1 to the second counter output COU2, and then outputs it.

The drive/process flow of FIG. 16 shows a method in which the first write method Y1 (TW1) is set as a default, and, when the second write method Y2 (TW2) is selected, trimming information is readout from the trimming parameter region TPA, and switching is performed. In other words, ordinarily, the high rewrite-operation number is prioritized, and, when the high-speed rewrite operation is selected, access to the trimming parameter region TPA is made, and yet, away opposite to this way may be employed. In other words, ordinarily, the write time is set at 3.5 ms (TW2), and a write time of 5 ms may be selected as an option. In any case, the present invention is capable of adjusting the write time, and is capable of facilitating one of a plurality of write times.

Although one preferred embodiment of the present invention has been described as above, the present invention can be embodied in other modes.

For example, a configuration in which the conductivity type of each semiconductor portion of the semiconductor chip 2 is inverted may be employed. For example, in the semiconductor chip 2, the p type portion may be an n type portion, and the n type portion may be a p type portion.

Besides, various design changes can be made within the scope of the subject matter described in the claims.

The invention claimed is:

1. A semiconductor device comprising:

a semiconductor substrate including a first region comprising a nonvolatile memory cell and a second region that is formed outside the first region and in which a semiconductor element differing from the nonvolatile memory cell is formed;

a plurality of first element separating portions by which the first region and the second region are electrically separated from each other;

a second element separating portion that is formed in the first region and that partitions the first region into a plurality of active regions; and a dummy region formed adjacently to a first portion that is one of the plurality of first element separating portions, the one being closest to the plurality of active regions, the first portion of the first element separating portions being equivalent in width to the second element separating portion.

2. The semiconductor device according to claim 1, wherein the plurality of first element separating portions further include a second portion that is formed on a side closer to the second region with respect to the first portion and that is larger in width than the second element separating portion.

3. The semiconductor device according to claim 2, wherein the dummy region is formed in a region sandwiched between the first portion and the second portion of the first element separating portion.

4. The semiconductor device according to claim 2, wherein the second portion of the first element separating portion is formed more deeply than the first portion of the first element separating portion.

5. The semiconductor device according to claim 1, wherein a width of the first portion of the first element separating portion is within ±20% of a width of the second element separating portion.

6. The semiconductor device according to claim 5, wherein the width of the second element separating portion is 0.32 μm to 0.52 μm, and the width of the first portion of the first element separating portion is 0.32 μm to 0.52 μm.

7. The semiconductor device according to claim 1, wherein the nonvolatile memory cell includes:

a second-conductivity-type source region and a second-conductivity-type drain region that are formed in the active region of the semiconductor substrate, the semiconductor substrate being of a first-conductivity type with an interval between the second-conductivity-type source region and the second-conductivity-type drain region;

a gate insulating film formed on the semiconductor substrate;

a floating gate selectively formed on the gate insulating film between the source region and the drain region;

a control gate formed on the floating gate;

a select gate selectively formed on the gate insulating film between the source region and the drain region;

a second-conductivity-type impurity region facing the floating gate in the semiconductor substrate; and a tunnel window that is formed at a portion between the floating gate and the impurity region in the gate insulating film and that is thinner than the gate insulating film around the portion.

8. The semiconductor device according to claim 7, wherein the dummy region has a first-conductivity-type portion at a front-surface portion of the semiconductor substrate.

9. The semiconductor device according to claim 7, wherein the semiconductor element includes a transistor that controls a voltage that is supplied to the control gate.

10. The semiconductor device according to claim 7, wherein the second element separating portion includes a trench formed at the semiconductor substrate and an insulator buried in the trench, and a lateral surface of the trench includes a first portion that is continuous with a front surface of the semiconductor substrate and that is tilted at an angle $\theta_1$ with respect to the front surface of the semiconductor substrate and a second portion that extends from the first portion of the trench toward a bottom portion of the trench and that is tilted at an angle $\theta_2$ greater than the angle $\theta_1$ with respect to the front surface of the semiconductor substrate.

11. The semiconductor device according to claim 10, wherein the lateral surface of the trench includes a third portion that is continuous with a bottom surface of the trench and that is tilted at an angle $\theta_3$ smaller than the angle $\theta_2$ with respect to the front surface of the semiconductor substrate.

12. The semiconductor device according to claim 10, wherein the second element separating portion includes an STI (Shallow Trench Isolation) structure.

13. The semiconductor device according to claim 10, wherein the control gate straddles the plurality of active regions and covers the second element separating portion, and a part of the control gate is selectively buried in a front-surface portion of the insulator in the trench.

14. The semiconductor device according to claim 1, further comprising a fourth element separating portion that is equivalent in width to the second element separating portion, the fourth element separating portion being formed between an active region of one unit made up of the plurality of active regions and a plurality of active regions of one unit adjoining the active region of one unit.

15. A semiconductor package comprising:

the semiconductor device according to claim 1; and a molding resin with which the semiconductor device is sealed.

* * * * *